United States Patent
Matsuo et al.

(10) Patent No.: US 10,401,736 B2
(45) Date of Patent: Sep. 3, 2019

(54) EXPOSURE DEVICE, SUBSTRATE PROCESSING APPARATUS, EXPOSURE METHOD OF SUBSTRATE AND SUBSTRATE PROCESSING METHOD

(71) Applicant: SCREEN Holdings Co., Ltd., Kyoto (JP)

(72) Inventors: Tomohiro Matsuo, Kyoto (JP); Yasuhiro Fukumoto, Kyoto (JP); Takafumi Oki, Kyoto (JP); Masaya Asai, Kyoto (JP); Masahiko Harumoto, Kyoto (JP); Yuji Tanaka, Kyoto (JP); Chisayo Nakayama, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 15/902,037

(22) Filed: Feb. 22, 2018

(65) Prior Publication Data

US 2018/0253012 A1    Sep. 6, 2018

(30) Foreign Application Priority Data

Mar. 1, 2017    (JP) .................................. 2017-038235

(51) Int. Cl.
*G03F 7/20* (2006.01)
*G03F 7/00* (2006.01)
(Continued)

(52) U.S. Cl.
CPC .............. *G03F 7/7055* (2013.01); *B81C 1/00* (2013.01); *G03F 7/0002* (2013.01); *G03F 7/168* (2013.01);
(Continued)

(58) Field of Classification Search
CPC ...... G03F 7/7055; G03F 7/0002; G03F 7/168; G03F 7/2004; G03F 7/70008; G03F 7/70858; G03F 7/70933; B81C 1/00; H01L 21/0274; H01L 21/31133; H01L 21/67115; H01L 21/67253; H01L 21/67748; H01L 21/68742
See application file for complete search history.

(56) References Cited

U.S. PATENT DOCUMENTS 5,763,892 A    6/1998  Kizaki et al. .............. 250/492.1
6,211,942 B1 *  4/2001  Okamoto ................ G03F 7/203
                                                              355/26
(Continued)

FOREIGN PATENT DOCUMENTS

CN    203037348 U    7/2013
JP    05-343288 A    12/1993
(Continued)

OTHER PUBLICATIONS

Office Action dated Nov. 7, 2018 in corresponding Taiwanese Patent Application No. 107105176.
(Continued)

*Primary Examiner* — Michelle M Iacoletti
(74) *Attorney, Agent, or Firm* — Ostrolenk Faber LLP

(57) ABSTRACT

An atmosphere in a processing chamber in which a substrate is stored is discharged by a suction device. At a time point at which oxygen concentration in the processing chamber is lowered to predetermined exposure starting concentration, emission of vacuum ultraviolet rays from a light source to the substrate is started. The emission of the vacuum ultraviolet rays to the substrate is stopped at a time point at which the exposure amount of the substrate increases to a predetermined set exposure amount. The exposure starting concentration is defined in advance to be higher than 1% and lower than oxygen concentration in the air, and is defined in advance such that ozone generated from oxygen atoms by the emission of the vacuum ultraviolet rays do not damage the film on the surface to be processed of the substrate.

16 Claims, 18 Drawing Sheets

(51) Int. Cl.
*H01L 21/027* (2006.01)
*G03F 7/16* (2006.01)
*B81C 1/00* (2006.01)
*H01L 21/311* (2006.01)
*H01L 21/67* (2006.01)
*H01L 21/677* (2006.01)
*H01L 21/687* (2006.01)

(52) U.S. Cl.
CPC ........ *G03F 7/2004* (2013.01); *G03F 7/70008* (2013.01); *G03F 7/70558* (2013.01); *G03F 7/70858* (2013.01); *G03F 7/70933* (2013.01); *H01L 21/0274* (2013.01); *H01L 21/31133* (2013.01); *H01L 21/67115* (2013.01); *H01L 21/67253* (2013.01); *H01L 21/67748* (2013.01); *H01L 21/68742* (2013.01)

(56) References Cited

U.S. PATENT DOCUMENTS

| | | | |
|---|---|---|---|
| 6,628,371 B1 | 9/2003 | Ishikawa | 355/69 |
| 6,842,500 B1 | 1/2005 | Komatsuda et al. | 378/34 |
| 2014/0185026 A1* | 7/2014 | Sasaki | G03F 7/70558 355/67 |
| 2016/0004168 A1* | 1/2016 | Neumann | G03F 7/70133 355/67 |
| 2016/0279651 A1 | 9/2016 | Miyagi et al. | 118/620 |
| 2016/0282725 A1 | 9/2016 | Miyagi et al. | 355/27 |

FOREIGN PATENT DOCUMENTS

| | | |
|---|---|---|
| JP | 10-284407 A | 10/1998 |
| JP | 2001-110710 A | 4/2001 |
| JP | 2001-284236 A | 10/2001 |
| JP | 2006-049730 A | 2/2006 |
| JP | 2015-222417 A | 12/2015 |
| JP | 2016-183990 A | 10/2016 |
| JP | 2016-183991 A | 10/2016 |
| TW | 416532 U | 12/2000 |

OTHER PUBLICATIONS

Office Action dated Jan. 25, 2019 in related U.S. Appl. No. 15/900,889.

* cited by examiner

EXPOSURE DEVICE, SUBSTRATE PROCESSING APPARATUS, EXPOSURE METHOD OF SUBSTRATE AND SUBSTRATE PROCESSING METHOD

BACKGROUND OF THE INVENTION

Field of the Invention

The present invention relates to an exposure device, a substrate processing apparatus, an exposure method of a substrate and a substrate processing method for performing exposure processing on the substrate.

Description of Related Art

In recent years, a photolithography technique utilizing Directed Self Assembly (DSA) of a block copolymer has been developed in order to realize a finer pattern formed on a substrate. In such a photolithography technique, heating processing is performed on the substrate to which a block polymer has been applied, and then one surface of the substrate is exposed. Thus, the block polymer is reformed. In this processing, it is required that an exposure amount of the substrate is accurately adjusted.

In JP 2016-183990 A, an exposure device that exposes a film (DSA film), including a Directed Self Assembly, on a substrate is described. The exposure device has a light emitter that can emit vacuum ultraviolet rays having strip-shape cross sections, and is configured to be movable from a position farther forward than the light emitter to a position farther rearward than the light emitter to cross paths of the vacuum ultraviolet rays emitted from the light emitter. Before the exposure processing, illuminance of the vacuum ultraviolet rays is detected in advance by an illuminance sensor, and a movement speed of the substrate is calculated based on the detected illuminance such that a desired exposure amount of the vacuum ultraviolet rays is emitted. During the exposure processing, the substrate moves at a calculated movement speed, so that the desired exposure amount of the vacuum ultraviolet rays is emitted to the DSA film on the substrate.

BRIEF SUMMARY OF THE INVENTION

During the exposure processing, when oxygen is present in the paths of the vacuum ultraviolet rays emitted to the substrate, oxygen molecules that receive the vacuum ultraviolet rays are separated into oxygen atoms, and the separated oxygen atoms are recoupled with other oxygen molecules. Thus, ozone is generated. In this case, the vacuum ultraviolet rays that reach the substrate are attenuated. As such, in JP 2016-183990 A, gas in the casing of the exposure device is discharged such that oxygen concentration during the exposure processing is lowered to a value equal to or lower than 1%. However, it requires a long period of time to discharge oxygen molecules, so that efficiency of the exposure processing for the substrate is lowered.

An object of the present invention is to provide an exposure device capable of improving efficiency of exposure processing for a substrate, a substrate processing apparatus in which the efficiency of the exposure processing for the substrate can be improved, and an exposure method and a substrate processing method by which the efficiency of the exposure processing for the substrate can be improved.

(1) An exposure device according to one aspect of the present invention includes a processing chamber that stores a substrate having a film that has been formed on a surface to be processed, a light source provided to be emittable of vacuum ultraviolet rays to the substrate stored in the processing chamber, a gas discharger that discharges an atmosphere in the processing chamber, an oxygen concentration meter that measures oxygen concentration in the processing chamber, an illuminometer that receives part of the vacuum ultraviolet rays and measures illuminance of the received vacuum ultraviolet rays during an emission period in which the vacuum ultraviolet rays are emitted from the light source to the substrate, an exposure amount calculator that calculates an exposure amount of the substrate based on the illuminance measured by the illuminometer, and a light source controller that controls the light source such that emission of the vacuum ultraviolet rays by the light source to the substrate is started at a time point at which the oxygen concentration measured by the oxygen concentration meter is lowered to predetermined exposure starting concentration, and controls the light source such that the emission of the vacuum ultraviolet rays by the light source to the substrate is stopped at a time point at which the exposure amount calculated by the exposure amount calculator is increased to a predetermined set exposure amount, wherein the exposure starting concentration is defined in advance to be higher than 1% and lower than oxygen concentration in air, and is defined such that ozone generated from oxygen atoms by the emission of the vacuum ultraviolet rays does not damage the film on the surface to be processed of the substrate.

In this exposure device, the substrate having the film that has been formed on the surface to be processed is stored in the processing chamber. The atmosphere in the processing chamber is discharged by the gas discharger. The oxygen concentration in the processing chamber is measured by the oxygen concentration meter. At the time point at which the oxygen concentration measured by the oxygen concentration meter is lowered to the predetermined exposure starting concentration, emission of the vacuum ultraviolet rays by the light source to the substrate is started. During the emission period in which the vacuum ultraviolet rays are emitted from the light source to the substrate, part of the vacuum ultraviolet rays is received by the illuminometer, and the illuminance of the received vacuum ultraviolet rays is measured. An exposure amount of the substrate is calculated based on the illuminance measured by the illuminometer. Emission of the vacuum ultraviolet rays by the light source to the substrate is stopped at the time point at which the calculated exposure amount increases to the predetermined set exposure amount. The exposure starting concentration is defined to be higher than 1% and lower than the oxygen concentration in the air, and is defined in advance such that ozone generated from the oxygen atoms by the emission of the vacuum ultraviolet rays does not damage the film on the surface to be processed of the substrate.

In this configuration, the vacuum ultraviolet rays are emitted from the light source to the substrate at a time point earlier than a time point at which the oxygen concentration in the processing chamber is lowered to 1%. Further, although a small amount of ozone is generated due to the emission of the vacuum ultraviolet rays to the substrate at this time point, this ozone does not damage the film formed on the surface to be processed of the substrate. Therefore, a time period required for the exposure processing can be shortened. Thus, efficiency of the exposure processing for the substrate can be improved.

(2) The exposure device may further include a gas supplier that supplies an inert gas into the processing chamber. In this case, the oxygen concentration in the processing chamber is lowered in the short period of time. Thus, efficiency of the exposure processing for the substrate can be more sufficiently improved.

(3) The exposure device may further include a platform, which is provided below the light source and on which the substrate is placed, and a platform controller that controls the platform such that the platform moves to a first position when the substrate is received and transferred between an inside and an outside of the processing chamber, and controls the platform such that the platform moves to a second position that is farther upward than the first position before or during the emission period in which the vacuum ultraviolet rays are emitted from the light source to the substrate. In this case, the substrate can be easily received and transferred between the inside and the outside of the processing chamber without interfering with the light source. Further, when the vacuum ultraviolet rays are emitted from the light source to the substrate, the light source and the substrate are in close proximity to each other. Thus, efficiency of the exposure processing for the substrate can be more sufficiently improved.

(4) The platform controller, after the substrate is placed on the platform at the first position, may control the platform such that the platform starts moving from the first position to the second position after the emission of the vacuum ultraviolet rays from the light source to the substrate is started. In this case, the vacuum ultraviolet rays are emitted to the substrate even in a process in which the platform moves from the first position to the second position. Therefore, the exposure of the substrate ends in a shorter period of time. Thus, efficiency of the exposure processing for the substrate can be more sufficiently improved.

(5) The placement controller, after the substrate is placed on the platform at the first position, may control the platform such that the platform starts moving from the first position to the second position before the emission of the vacuum ultraviolet rays from the light source to the substrate is started. In this case, the platform can move to the second position during a period in which the oxygen concentration in the processing chamber is lowered to the exposure starting concentration. Therefore, the exposure of the substrate ends in a shorter period of time. Thus, efficiency of the exposure processing for the substrate can be more sufficiently improved.

(6) The placement controller, after the vacuum ultraviolet rays are emitted to the substrate placed on the platform at the second position, may control the platform such that the platform starts moving from the second position to the first position before the exposure amount calculated by the exposure amount calculator increases to the set exposure amount. In this case, even in the process in which the platform moves from the second position to the first position, the vacuum ultraviolet rays are emitted to the substrate. Therefore, the substrate is carried out from the processing chamber at an earlier time point, and the exposure processing ends. Thus, efficiency of the exposure processing for the substrate can be more sufficiently improved.

(7) The illuminometer may have a light receiving surface that receives the vacuum ultraviolet rays, and may be arranged such that the light receiving surface is located at a constant height, which is based on the surface to be processed of the substrate during the emission period of the vacuum ultraviolet rays. In this case, an attenuation rate of the vacuum ultraviolet rays emitted from the light source to the surface to be processed of the substrate and an attenuation rate of the vacuum ultraviolet rays emitted from the light source to the receiving surface of the illuminometer are correlated. Therefore, the illuminance of the vacuum ultraviolet rays emitted to the surface to be processed of the substrate can be accurately acquired based on the illuminance measured by the illuminometer. Thus, an exposure amount of the substrate can be accurately calculated based on the illuminance measured by the illuminometer.

(8) The illuminometer may be arranged such that the light receiving surface is located at a height that is same as a height of the surface to be processed of the substrate during the emission period of the vacuum ultraviolet rays. In this case, an attenuation rate of the vacuum ultraviolet rays emitted from the light source to the surface to be processed of the substrate and an attenuation rate of the vacuum ultraviolet rays emitted from the light source to the light receiving surface of the illuminometer are equal to each other. Thus, the illuminance of the vacuum ultraviolet rays emitted to the surface to be processed of the substrate and the illuminance measured by the illuminometer are equal to each other. As a result, the exposure amount of the substrate can be more easily calculated based on the illuminance measured by the illuminometer.

(9) The illuminometer may follow movement of the platform and may move in an up-and-down direction. In this case, also during the movement of the platform, the light receiving surface of the illuminometer is located at a constant height that is based on the surface to be processed of the substrate during the emission period of the vacuum ultraviolet rays. Therefore, even in the case where the vacuum ultraviolet rays are emitted to the substrate during the movement of the platform, an accurate exposure amount of the substrate can be calculated.

(10) The illuminometer may be attached to the platform. In this case, the illuminometer can follow the movement of the platform and be easily moved in an up-and-down direction.

(11) The light source may be configured to emit the vacuum ultraviolet rays having planar cross sections. In this case, the vacuum ultraviolet rays are emitted to a wide area. Therefore, the exposure of the substrate ends in a shorter period of time. Thus, efficiency of exposure processing for the substrate can be more sufficiently improved.

(12) An emission area of the vacuum ultraviolet rays emitted by the light source may be larger than an area of the substrate. In this case, the entire surface of the substrate can be exposed, so that the exposure of the substrate ends in an even shorter period of time. Thus, the efficiency of the exposure processing for the substrate can be more sufficiently improved.

(13) A substrate processing apparatus according to another aspect of the present invention includes a coater that forms a film on a substrate by applying a processing liquid to the substrate, a thermal processor that thermally processes the substrate on which the film has been formed by the coater, the exposure device according to one aspect of the present invention that exposes the substrate that has been thermally processed by the thermal processor, and a developer that develops the film on the substrate by supplying a solvent to the substrate that has been exposed by the exposure device.

In this substrate processing apparatus, the processing liquid is applied to the substrate by the coater, so that the film is formed on the substrate. The substrate on which the film has been formed by the coater is thermally processed by the thermal processor. The substrate that has been thermally processed by the thermal processor is exposed by the above-mentioned exposure device. The solvent is supplied to the substrate, which has been exposed by the exposure device, by the developer. Thus, the film of the substrate is developed.

In the exposure device, the vacuum ultraviolet rays are emitted from the light source to the substrate at a time point earlier than a time point at which the oxygen concentration in the processing chamber is lowered to 1%, whereby a time period required to perform the exposure processing can be shortened. Thus, efficiency of the exposure processing for the substrate can be improved.

(14) The processing liquid may include a Directed Self Assembly material. In this case, the substrate to which the processing liquid including the Directed Self Assembly material has been applied is thermally processed, so that a microphase separation occurs on one surface of the substrate. Further, the substrate on which patterns of two types of polymers have been formed by the microphase separation is exposed and developed. Thus, one of the two types of polymers is removed, and a fine pattern can be formed.

(15) An exposure method according to yet another aspect of the present invention includes the steps of storing a substrate having a film that has been formed on a surface to be processed in a processing chamber, discharging an atmosphere in the processing chamber by a gas discharger, measuring oxygen concentration in the processing chamber by an oxygen concentration meter, starting emission of vacuum ultraviolet rays by a light source to the substrate at a time point at which the oxygen concentration measured by the oxygen concentration meter is lowered to predetermined exposure starting concentration, receiving part of the vacuum ultraviolet rays by an illuminometer and measuring illuminance of the received vacuum ultraviolet rays during an emission period in which the vacuum ultraviolet rays are emitted from the light source to the substrate, calculating an exposure amount of the substrate based on the illuminance measured by the illuminometer, and stopping the emission of the vacuum ultraviolet rays by the light source to the substrate at a time point at which the calculated exposure amount increases to a predetermined set exposure amount, wherein the exposure starting concentration is defined in advance to be higher than 1% and lower than oxygen concentration in air, and is defined in advance such that ozone generated from oxygen atoms by the emission of the vacuum ultraviolet rays does not damage the film on the surface to be processed of the substrate.

With this exposure method, the vacuum ultraviolet rays are emitted from the light source to the substrate at a time point earlier than a time point at which the oxygen concentration in the processing chamber is lowered to 1%, so that a time period required for the exposure processing can be shortened. Thus, efficiency of the exposure processing for the substrate can be improved.

(16) A substrate processing method according to yet another aspect of the present invention includes the steps of forming a film on a substrate by applying a processing liquid to a surface to be processed of the substrate by a coater, thermally processing the substrate, on which the film has been formed by the coater, by a thermal processor, the exposure method according to yet another aspect of the present invention that exposes the substrate, which has been thermally processed by the thermal processor, by an exposure device, and developing the film of the substrate by supplying a solvent to the surface to be processed of the substrate, which has been exposed by the exposure device, by a developer.

With this substrate processing method, the substrate on which the film has been formed and which has not been developed is exposed by the vacuum ultraviolet rays. With the exposure method, the vacuum ultraviolet rays are emitted to the substrate from the light source at a time point earlier than a time point at which the oxygen concentration in the processing chamber is lowered to 1%. Therefore, a time period required for the exposure processing can be shortened. Thus, efficiency of the exposure processing for the substrate can be improved.

Other features, elements, characteristics, and advantages of the present invention will become more apparent from the following description of preferred embodiments of the present invention with reference to the attached drawings.

BRIEF DESCRIPTION OF THE SEVERAL
VIEWS OF THE DRAWING

DESCRIPTION OF THE PREFERRED
EMBODIMENTS

[1] First Embodiment
(1) Configuration of Exposure Device
The exposure device, a substrate processing apparatus, an exposure method and a substrate processing method according to the first embodiment of the present invention will be described below with reference to drawings. In the following description, a substrate refers to a semiconductor substrate, a substrate for an FPD (Flat Panel Display) such as a liquid crystal display device or an organic EL (Electro Luminescence) display device, a substrate for an optical disc, a substrate for a magnetic disc, a substrate for a magneto-optical disc, a substrate for a photomask, a substrate for solar cells or the like.

Figure 1:
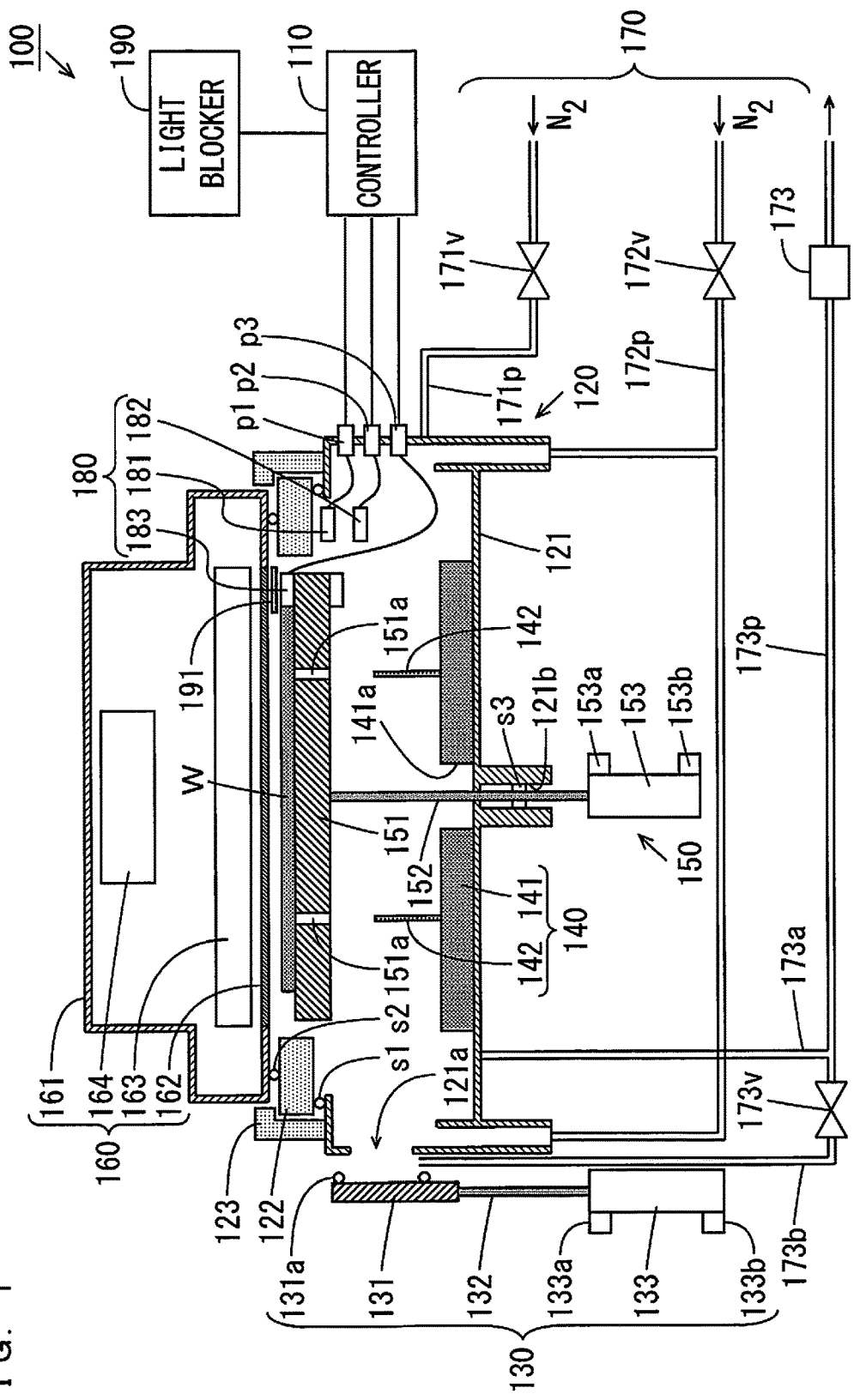
FIG. 1 is a schematic cross sectional view showing a configuration of an exposure device according to a first embodiment of the present invention.

FIG. 1 is a schematic cross sectional view showing a configuration of the exposure device according to the first embodiment of the present invention. As shown in FIG. 1, the exposure device 100 includes a controller 110, a processing chamber 120, a closer 130, a receiver-transferer 140, a lifter-lowerer 150, a light emitter 160, a replacer 170, a measurer 180 and a light blocker 190. The controller 110 acquires a measurement value from the measurer 180 and controls operations of the closer 130, the lifter-lowerer 150, the light emitter 160, the replacer 170 and the light blocker 190. Functions of the controller 110 will be described below.

The processing chamber 120 includes a casing 121 having an upper opening and an inner space, an annular member 122 and a cover member 123. A transport opening 121a for transporting a substrate W to be processed between the inside and the outside of the casing 121 is formed in a side surface of the casing 121. In the present embodiment, a film including a Directed Self Assembly material (hereinafter referred to as a DSA (Directed Self Assembly) film) is formed on the substrate W to be processed. Further, an opening 121b through which a coupling member 152 of the lifter-lowerer 150, described below, passes is formed in a bottom surface of the casing 121.

A housing 161 of the light emitter 160, described below, is arranged in an upper portion of the casing 121 via the annular member 122, so that the upper opening of the casing 121 is closed. Seal members s1, s2 are attached between the casing 121 and the annular member 122, and between the annular member 122 and the housing 161, respectively. Further, the cover member 123 is attached between the casing 121 and the housing 161 to cover an outer peripheral surface of the annular member 122.

The closer 130 includes a shutter 131, a bar-shape coupling member 132 and a driving device 133. The coupling member 132 couples the shutter 131 to the driving device 133. The driving device 133 is a stepping motor, for example. The driving device 133 moves the shutter 131 between an open position at which the shutter 131 opens the transport opening 121a and a close position at which the shutter 131 closes the transport opening 121a.

A seal member 131a is attached to the shutter 131. With the shutter 131 located at the close position, the seal member 131a adheres to a portion surrounding the transport opening 121a in the casing 121, so that the inside of the casing 121 is sealed. In order to prevent friction between the seal member 131a and the casing 121, the driving device 133 moves the shutter 131 in an up-and-down direction with the shutter 131 spaced apart from the casing 121 when moving the shutter 131 between the open position and the close position.

Position sensors 133a, 133b that respectively detect an upper limit position and a lower limit position of the shutter 131 are attached to the driving device 133. The position sensors 133a, 133b supply results of detection to the controller 110. In the present embodiment, the driving device 133 and driving devices 153, 192, described below, are provided outside of the processing chamber 120. Therefore, even in the case where particles and the like are generated due to driving of the driving devices 133, 153, 192, particles and the like are prevented from directly entering the casing 121.

The receiver-transferer 140 includes a disc-shape support plate 141 and a plurality (three in the present example) of support pins 142, for example. The support plate 141 is arranged in a horizontal attitude in the casing 121. An opening 141a through which the coupling member 152 of the lifter-lowerer 150, described below, passes is formed in a central portion of the support plate 141. The plurality of support pins 142 extend upwardly from an upper surface of the support plate 141 to surround the opening 141a. The substrate W to be processed can be placed at the upper ends of the plurality of support pins 142.

The lifter-lowerer 150 includes a flat plate-shaped platform plate 151, the bar-shape coupling member 152 and the driving device 153. The platform plate 151 is arranged above the support plate 141 of the receiver-transferer 140 in a horizontal attitude in the casing 121. A plurality of through holes 151a respectively corresponding to the plurality of support pins 142 of the support plate 141 are formed in the platform plate 151.

The coupling member 152 is arranged to extend upwardly and downwardly through the opening 121b of the casing 121 and the opening 141a of the support plate 141, and the driving device 153 is arranged below the casing 121. The coupling member 152 couples the platform plate 151 to the driving device 153. A seal member s3 is arranged between an outer peripheral surface of the coupling member 152 and an inner peripheral surface of the opening 121b such that the coupling member 152 can slide in the up-and-down direction.

The driving device 153 is a stepping motor, for example, and moves the platform plate 151 in the up-and-down direction between a processing position farther upward than the upper ends of the plurality of support pins 142 and a waiting position farther downward than the upper ends of the plurality of support pins 142. With the platform plate 151 located at the waiting position, the plurality of support pins 142 are respectively inserted into the plurality of through holes 151a. Position sensors 153a, 153b that respectively detect an upper limit position and a lower limit position of the platform plate 151 are attached to the driving device 153. The position sensors 153a, 153b supply results of detection to the controller 110.

The light emitter 160 includes the housing 161 having a lower opening and an inner space, a light-transmitting plate 162, a planar light source 163 and a power supply device 164. In the present embodiment, the light-transmitting plate 162 is a quartz glass plate. As a material for the light-transmitting plate 162, another material that transmits vacuum ultraviolet rays, described below, may be used. As described above, the housing 161 is arranged in the upper portion of the casing 121 to close the upper opening of the casing 121. The light-transmitting plate 162 is attached to the housing 161 to close the lower opening of the housing 161. The inner space of the casing 121 and the inner space of the housing 161 are separated from each other by the light-transmitting plate 162 while being optically accessible.

The light source 163 and the power supply device 164 are stored in the housing 161. In the present embodiment, the light source 163 is constituted by a plurality of bar-shape light sources, which emit vacuum ultraviolet rays having a wavelength of about not less than 120 nm and not more than about 230 nm and are horizontally arranged at predetermined intervals. Each light source may be a xenon excimer lamp, or may be another excimer lamp or a deuterium lamp, for example. The light source 163 emits the vacuum ultraviolet rays having substantially uniform light quantity distribution in the casing 121 through the light-transmitting plate 162. An area of an emission surface of the vacuum ultraviolet rays in the light source 163 is larger than an area of the surface to be processed of the substrate W. The power supply device 164 supplies electric power to the light source 163.

The replacer 170 includes pipes 171p, 172p, 173p, valves 171v, 172v and a suction device 173. The pipes 171p, 172p are connected between gas supply ports of the casing 121 and supply sources of an inert gas. In the present embodiment, the inert gas is a nitrogen gas, for example. The valves 171v, 172v are inserted into the pipes 171p, 172p.

The inert gas is supplied into the casing 121 from a position farther sideward than the support plate 141 through the pipe 171p. The inert gas is supplied into the casing 121 from a position farther downward than the support plate 141 through the pipe 172p. A flow rate of the inert gas is adjusted by the valves 171v, 172v.

The pipe 173p branches into a branch pipe 173a and a branch pipe 173b. The branch pipe 173a is connected to a gas discharge port of the casing 121, and the end of the branch pipe 173b is arranged between the casing 121 and the shutter 131. The suction device 173 is inserted into the pipe 173p. A valve 173v is inserted into the branch pipe 173b. The suction device 173 is an ejector, for example. The pipe 173p is connected to a gas discharge system. The suction device 173 discharges an atmosphere in the casing 121 through the branch pipe 173a and the pipe 173p. Further, the suction device 173 discharges an atmosphere between the casing 121 and the shutter 131 together with particles and the like generated by movement of the shutter 131 through the branch pipe 173b and the pipe 173p. The gas discharged by the suction device 173 is detoxed by the gas discharge system.

The measurer 180 includes an oxygen concentration meter 181, an ozone concentration meter 182 and an illuminometer 183. The oxygen concentration meter 181, the ozone concentration meter 182 and the illuminometer 183 are connected to the controller 110 through connection ports p1, p2, p3 provided in the casing 121, respectively. The oxygen concentration meter 181 is a galvanic cell type oxygen sensor or a zirconium-type oxygen sensor, for example, and measures oxygen concentration in the casing 121. The ozone concentration meter 182 measures ozone concentration in the casing 121.

Figure 2:
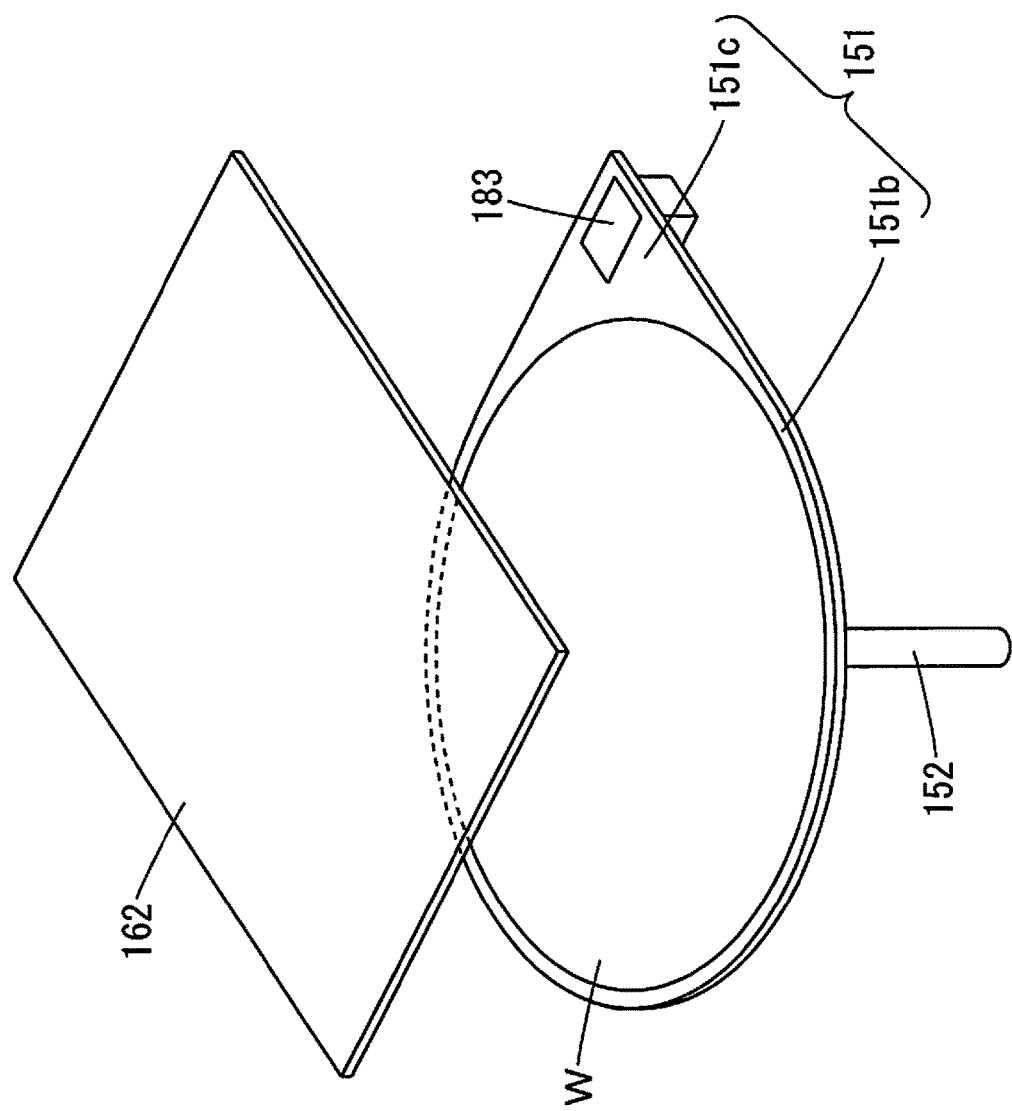
FIG. 2 is a diagram for explaining arrangement of an illuminometer.

The illuminometer 183 includes a light-receiving element such as a photodiode, and measures illuminance of the vacuum ultraviolet rays emitted to the light receiving surface of the light receiving element from the light source 163. Here, illuminance is a work rate of the vacuum ultraviolet rays emitted to the light-receiving surface per unit area. A unit of illuminance is represented by "$W/m^2$", for example. In the present embodiment, the illuminometer 183 is attached to the platform plate 151 such that the light receiving surface of the light-receiving element is located at a height that is substantially the same as the height of the surface to be processed of the substrate W. FIG. 2 is a diagram for explaining arrangement of the illuminometer 183.

As shown in FIG. 2, the light-transmitting plate 162 is rectangular, and the substrate W is circular. Therefore, portions in the vicinity of corners of the light-transmitting plate 162 do not overlap with the substrate W located at the processing position when seen in plan view. As such, the platform plate 151 includes a circular portion 151b that overlaps with a center portion of the light-transmitting plate 162 and a corner portion 151c that overlaps with one portion in the vicinity of one corner of the light-transmitting plate 162. The substrate W is placed on the circular portion 151b during the exposure processing. The illuminometer 183 is attached to the corner portion 151c. In this arrangement, the illuminometer 183 can measure the illuminance of the vacuum ultraviolet rays without interfering with the substrate W.

Figure 3:
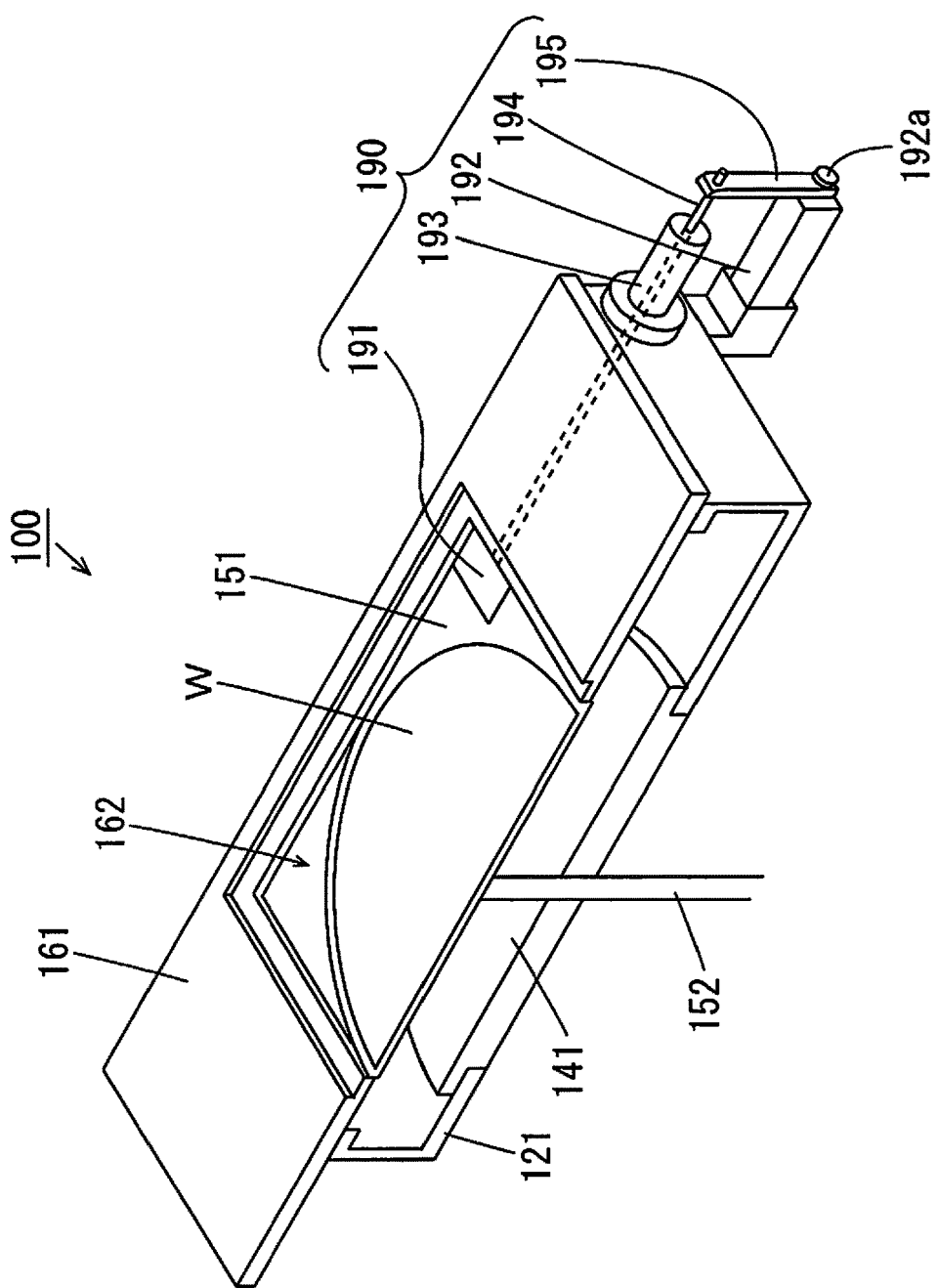
FIG. 3 is a cross sectional perspective view of the exposure device.
Figure 4:
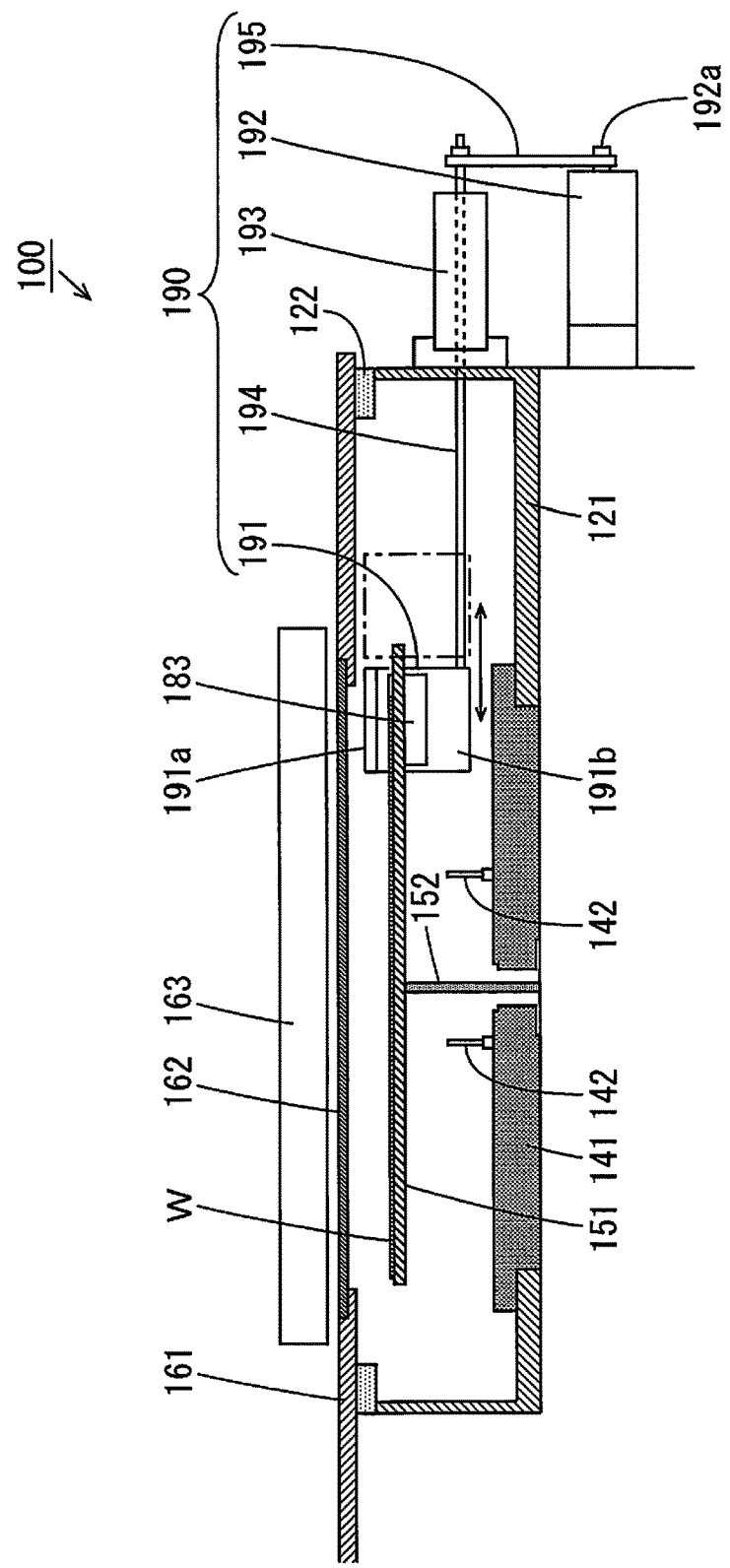
FIG. 4 is a longitudinal cross sectional view of the exposure device.

FIG. 3 is a cross sectional perspective view of the exposure device 100 of FIG. 1. FIG. 4 is a longitudinal cross sectional view of the exposure device 100 of FIG. 3. In FIGS. 3 and 4, part of the constituent elements is not shown in order to facilitate understanding of an inner configuration of the exposure device 100. As shown in FIGS. 3 and 4, the light blocker 190 includes a light blocking member 191, a driving device 192, a guide 193 and a bar-shape support member 194 and a planar coupling member 195.

The driving device 192 is an air cylinder, for example, and has a driving shaft 192a that can advance and retreat in one direction. The driving device 192 is attached to an outer surface of the casing 121. The guide 193 is attached to the outer surface of the casing 121, and movably guides the support member 194 in a direction in parallel with an advancing retreating direction of the driving shaft 192a. The support member 194 is provided to penetrate a sidewall of the casing 121 through the guide 193.

The light blocking member 191 has a reversed L-shaped cross section formed of a horizontal plate 191a and a vertical plate 191b. A lower end of the vertical plate 191b is attached to one end of the support member 194 in the casing 121. The coupling member 195 couples the other end of the support member 194 to a tip portion of the driving shaft 192a of the driving device 192 at a position outside of the casing 121.

As indicated by an arrow in FIG. 4, the driving shaft 192a of the driving device 192 advances and retreats, so that the light blocking member 191 moves between a light blocking position and a light non-blocking position. Here, the light blocking position is a position of the light blocking member 191 at which the horizontal plate 191a blocks the vacuum ultraviolet rays emitted from the light source 163 to the illuminometer 183. The light non-blocking position is a position of the light blocking member 191 at which the horizontal plate 191a does not block the vacuum ultraviolet rays emitted from the light source 163 to the illuminometer 183. In FIG. 4, the light blocking member 191 located at the light blocking position is indicated by a solid line, and the light blocking member 191 located at the light non-blocking position is indicated by a one-dot and dash line.

(2) Schematic Operation of Exposure Device

In the exposure device 100 of FIG. 1, the vacuum ultraviolet rays are emitted from the light source 163 to the substrate W, so that the exposure processing is performed. However, in the case where the oxygen concentration in the casing 121 is high, oxygen molecules absorb the vacuum ultraviolet rays and are separated into oxygen atoms, and the separated oxygen atoms are recoupled with other oxygen molecules. Thus, ozone is generated. In this case, the vacuum ultraviolet rays that reach the substrate W are attenuated. Attenuation of the vacuum ultraviolet rays is larger than attenuation of ultraviolet rays having a wavelength larger than about 230 nm.

Figure 5:
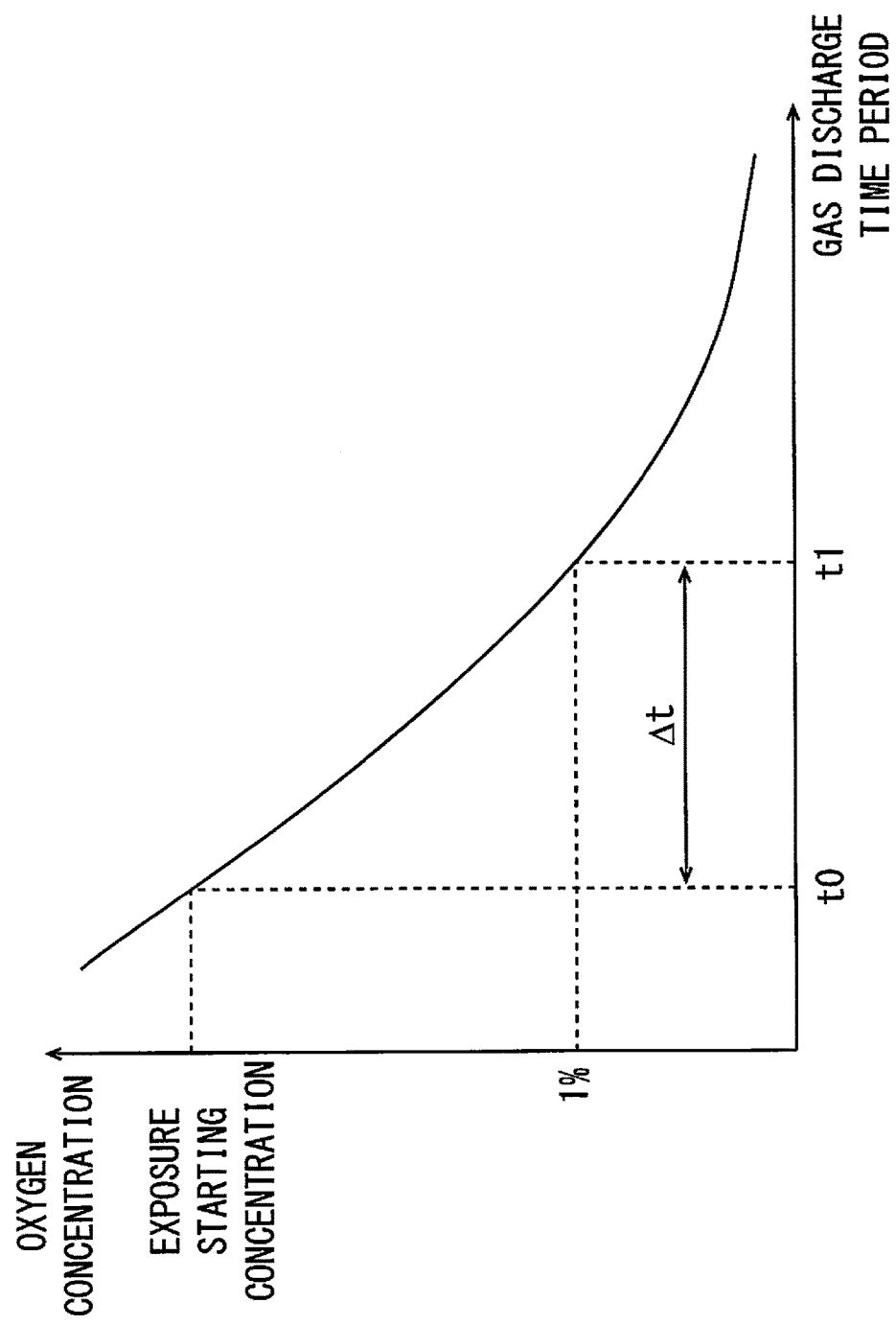
FIG. 5 is a graph indicating a relationship between oxygen concentration in a casing and a gas discharge time period.

As such, during the exposure processing, the atmosphere in the casing 121 is replaced with the inert gas by the replacer 170. Thus, the oxygen concentration in the casing 121 is lowered. FIG. 5 is a graph showing a relationship between the oxygen concentration in the casing 121 and a gas discharge time period. The ordinate of FIG. 5 indicates the oxygen concentration, and the abscissa indicates the gas discharge time period. As shown in FIG. 5, the longer the gas discharge time period is, the lower the oxygen concentration in the casing 121 is. At a time point t0 at which the oxygen concentration measured by the oxygen concentration meter 181 is lowered to predetermined exposure starting concentration, emission of the vacuum ultraviolet rays from the light source 163 to the substrate W is started.

Here, the exposure starting concentration is the predetermined oxygen concentration at which the vacuum ultraviolet rays can reach the substrate W from the light source 163, and at which ozone does not damage the film formed on the surface to be processed of the substrate W. While differing depending on a type of the film formed on the substrate W to be processed and its components, the specific exposure starting concentration is higher than the oxygen concentration of 1% at which oxygen is considered to be hardly remaining in the casing 121, and is lower than the oxygen concentration in the air. The oxygen concentration is lowered to 1% at a time point t1. In the present embodiment, emission of the vacuum ultraviolet rays is started at the time point t0 that is earlier than the time point t1 at which the oxygen concentration is lowered to 1% by $\Delta t$. Thus, a time period required for the exposure processing can be shortened.

In the case where an exposure amount of the vacuum ultraviolet rays emitted to the substrate W by the light source 163 reaches a predetermined set exposure amount, emission of the vacuum ultraviolet rays is stopped, and the exposure processing ends. Here, the exposure amount is energy of the vacuum ultraviolet rays emitted to the surface to be processed of the substrate W per unit area during the exposure processing. The unit of the exposure amount is represented by "$J/m^2$", for example. Therefore, the exposure amount of the vacuum ultraviolet rays is acquired by integration of the illuminance of the vacuum ultraviolet rays measured by the illuminometer 183.

Figure 6:
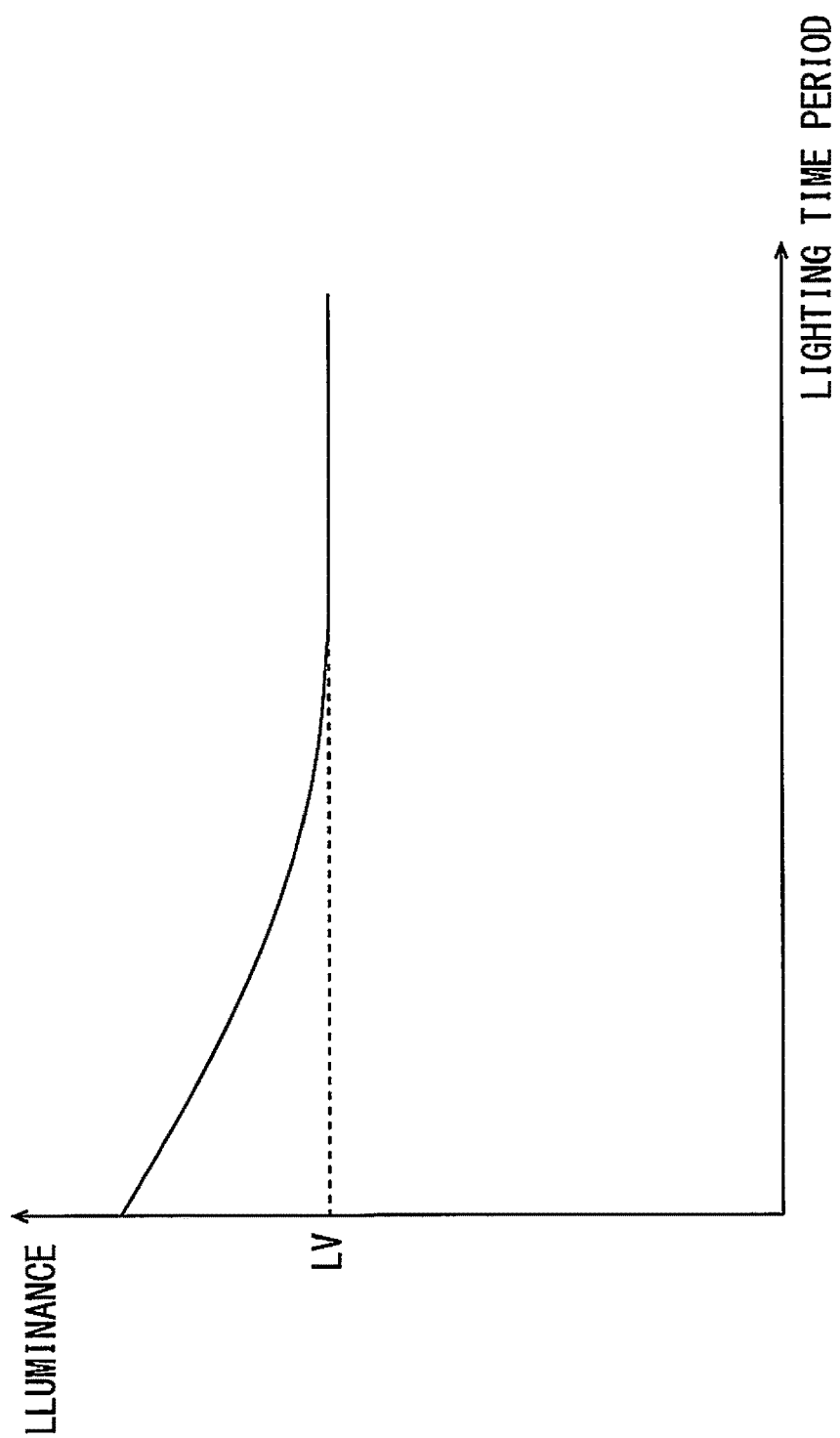
FIG. 6 is a graph showing a relationship between illuminance of vacuum ultraviolet rays emitted by a light source to a substrate and a lighting time period of the light source.

FIG. 6 is a graph showing a relationship between illuminance of the vacuum ultraviolet rays emitted from the light source 163 and a lighting time period of the light source 163. The ordinate of FIG. 6 indicates the illuminance, and the abscissa of FIG. 6 indicates the lighting time period. The light source 163 that emits the vacuum ultraviolet rays is relatively costly. Therefore, during a period in which the vacuum ultraviolet rays are not emitted to the substrate W, electric power supplied from the power supply device 164 to the light source 163 is preferably cut off, and the light source 163 is preferably turned off. Thus, the useful life of the light source 163 can be prolonged.

However, as shown in FIG. 6, right after the light source 163 lights up, the illuminance of the vacuum ultraviolet rays emitted to the substrate W is lowered with time and settles at a constant value LV after a predetermined time period has elapsed. Therefore, it is difficult to measure the illuminance having the constant value LV before the exposure processing. In the present embodiment, during the exposure processing, the vacuum ultraviolet rays are simultaneously emitted to the substrate W and the illuminometer 183. Therefore, in the case where the illuminance of the vacuum ultraviolet rays emitted to the substrate W changes, the illuminance of the vacuum ultraviolet rays measured by the illuminometer 183 changes similarly.

Further, as described above, in the present embodiment, the illuminometer 183 is provided such that the light receiving surface of the light receiving element is located at the height that is substantially the same as the height of the surface to be processed of the substrate W. Therefore, even in the case where the vacuum ultraviolet rays are partially absorbed by the oxygen molecules remaining between the substrate W and the light source 163 and are attenuated, substantially the same degree of the vacuum ultraviolet rays reaches the surface to be processed of the substrate W and the light receiving surface of the illuminometer 183. The illuminance of the vacuum ultraviolet rays emitted to the surface to be processed of the substrate W and the illuminance measured by the illuminometer 183 are equal to each other. As a result, the illuminance of the vacuum ultraviolet rays that reach the substrate W can be accurately measured with a simple configuration.

On the other hand, when the vacuum ultraviolet rays are continuously emitted to the illuminometer 183 for a long period of time, the illuminometer 183 is likely to deteriorate, and the useful life of the illuminometer 183 is shortened. Further, frequency of conducting maintenance work such as calibration of the illuminometer 183 increases. In the present embodiment, during the exposure processing, the light blocking member 191 moves between the light blocking position and the light non-blocking position. In this case, the vacuum ultraviolet rays are intermittently emitted to the illuminometer 183, and the speed of deterioration of the illuminometer 183 is lowered as compared to the case where the vacuum ultraviolet rays are continuously emitted to the illuminometer 183. Thus, the useful life of the illuminometer 183 is prolonged. Further, the frequency of conducting the maintenance work of the illuminometer 183 can be reduced. In this configuration, during a period in which the light blocking member 191 is located at the light blocking position (hereinafter referred to as a light blocking period), the illuminance of the vacuum ultraviolet rays emitted to the substrate W is not measured. Therefore, the illuminance of the vacuum ultraviolet rays emitted to the substrate W during the light blocking period is preferably interpolated. The illuminance during the light blocking period can be interpolated based on the illuminance measured by the illuminometer 183 before and after the light blocking period. For example, values of illuminance measured before and after the light blocking period are connected by a spline curve, so that the spline interpolation of the illuminance during the light blocking period can be performed.

(3) Controller

Figure 7:
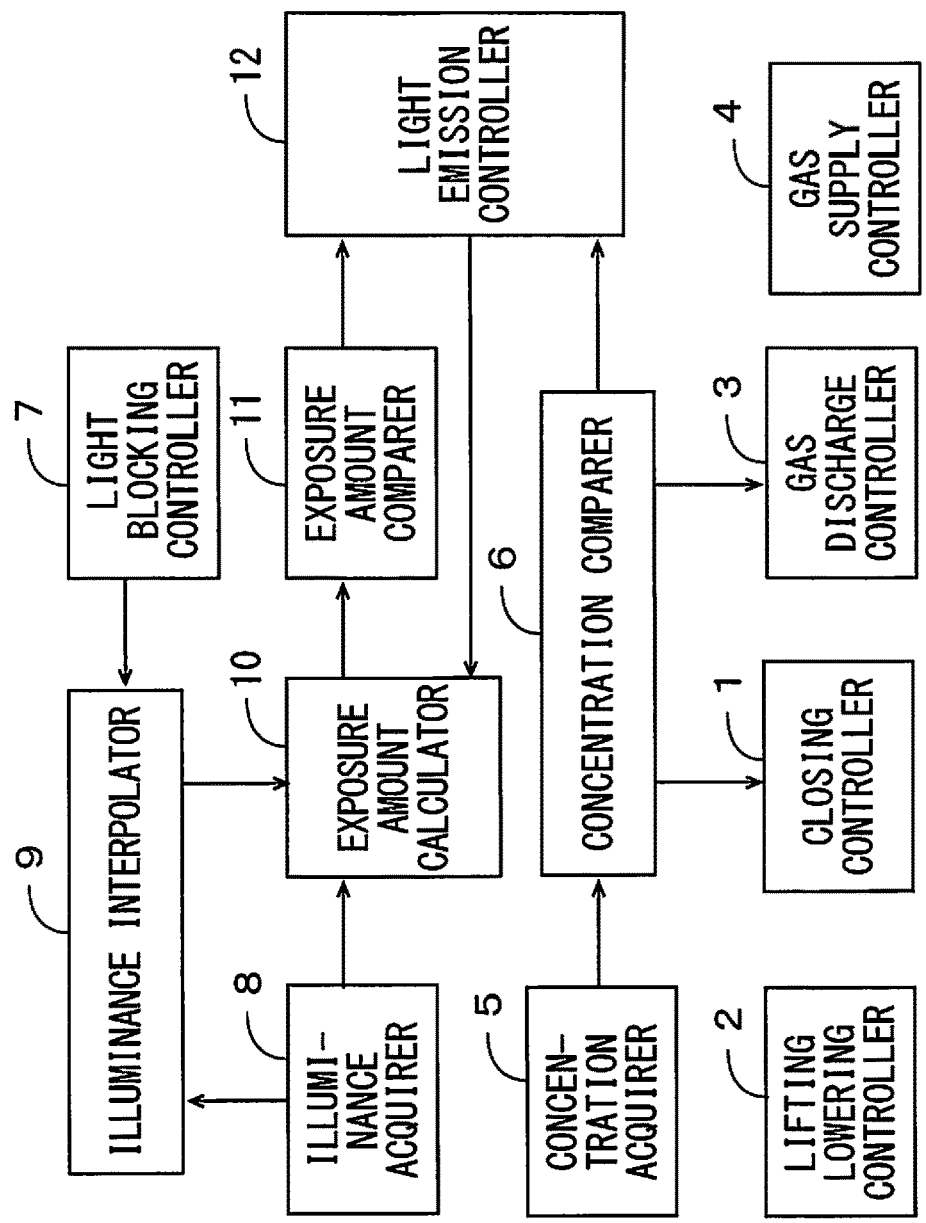
FIG. 7 is a functional block diagram showing a configuration of a controller of FIG. 1.

FIG. 7 is a functional block diagram showing a configuration of the controller 110 of FIG. 1. As shown in FIG. 7, the controller 110 includes a closing controller 1, a lifting lowering controller 2, a gas discharge controller 3, a gas supply controller 4, a concentration acquirer 5, a concentration comparer 6, a light blocking controller 7, an illuminance acquirer 8, an illuminance interpolator 9, an exposure amount calculator 10, an exposure amount comparer 11 and a light emission controller 12.

The controller 110 is constituted by a CPU (Central Processing Unit) and a memory, for example. A control program is stored in advance in the memory of the controller 110. The function of each part of the controller 110 is realized when the CPU of the controller 110 executes the control program stored in the memory.

The closing controller 1 controls the driving device 133 such that the shutter 131 moves between the close position and the open position based on results of detection of the position sensors 133a, 133b of FIG. 1. The lifting lowering controller 2 controls the driving device 153 based on results of detection of the position sensors 153a, 153b of FIG. 1 such that the platform plate 151 moves between the waiting position and the processing position.

The gas discharge controller 3 controls the suction device 173 and the valve 173v such that an atmosphere in the casing 121 and an atmosphere between the casing 121 and the shutter 131 of FIG. 1 are discharged. The gas supply controller 4 controls the valves 171v, 172v of FIG. 1 such that the inert gas is supplied into the casing 121.

The concentration acquirer 5 acquires a value of the oxygen concentration measured by the oxygen concentration meter 181 of FIG. 1. The concentration comparer 6 compares the oxygen concentration measured by the concentration acquirer 5 to the exposure starting concentration.

The light blocking controller 7 controls the driving device 192 such that the light blocking member 191 of FIG. 4 moves back and forth between the light blocking position and the light non-blocking position. The illuminance acquirer 8 acquires a value of illuminance of the vacuum ultraviolet rays measured by the illuminometer 183 of FIG. 1. The illuminance interpolator 9 interpolates the illuminance of the vacuum ultraviolet rays emitted to the substrate W during the light blocking period based on a control time point of the light blocking member 191 controlled by the light blocking controller 7 and a value of illuminance acquired by the illuminance acquirer 8.

The exposure amount calculator 10 calculates an exposure amount of the vacuum ultraviolet rays emitted to the substrate W based on the illuminance of the vacuum ultraviolet rays acquired by the illuminance acquirer 8, the illuminance of the vacuum ultraviolet rays interpolated by the illuminance interpolator 9 and an emission time period during which the vacuum ultraviolet rays are emitted from the light source 163 of FIG. 1 to the substrate W. The exposure amount comparer 11 compares an exposure amount calculated by the exposure amount calculator 10 to a predetermined set exposure amount.

The light emission controller 12 controls the supply of electrical power from the power supply device 164 to the light source 163 of FIG. 1 such that the light source 163 emits the vacuum ultraviolet rays based on a result of comparison by the concentration comparer 6. Further, the light emission controller 12 supplies a time period during which electric power is supplied from the power supply device 164 to the light source 163 as the emission time period during which the vacuum ultraviolet rays are emitted from the light source 163 to the substrate W. Further, the light emission controller 12 controls the power supply device 164 such that the light source 163 stops emission of the vacuum ultraviolet rays based on a result of comparison by the exposure amount comparer 11.

(4) Exposure Processing

Figure 10:
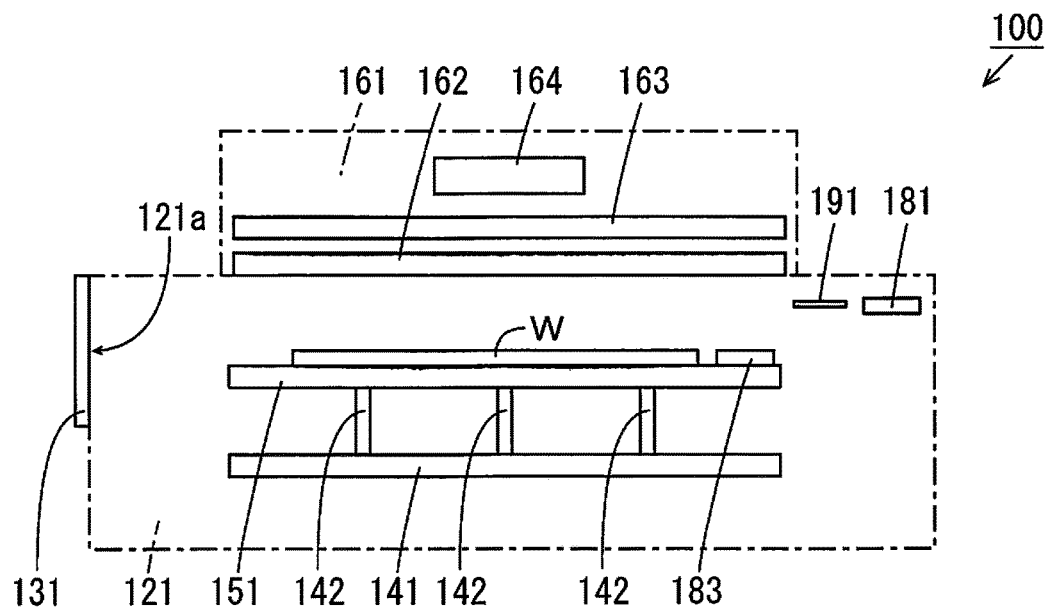
FIG. 10 is a schematic diagram for explaining the operation of the exposure device.
Figure 11:
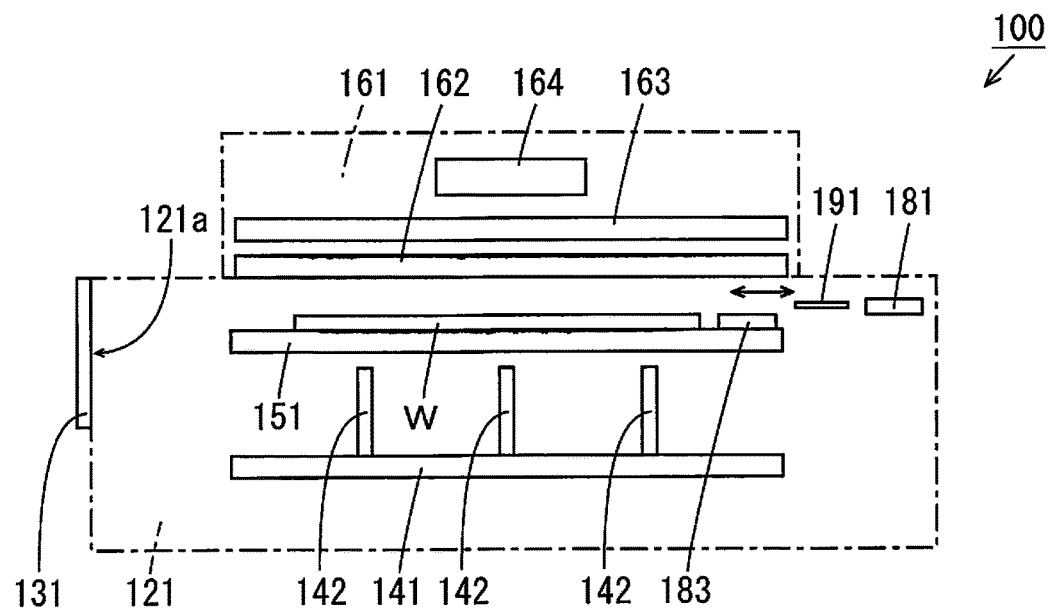
FIG. 11 is a schematic diagram for explaining the operation of the exposure device.
Figure 12:
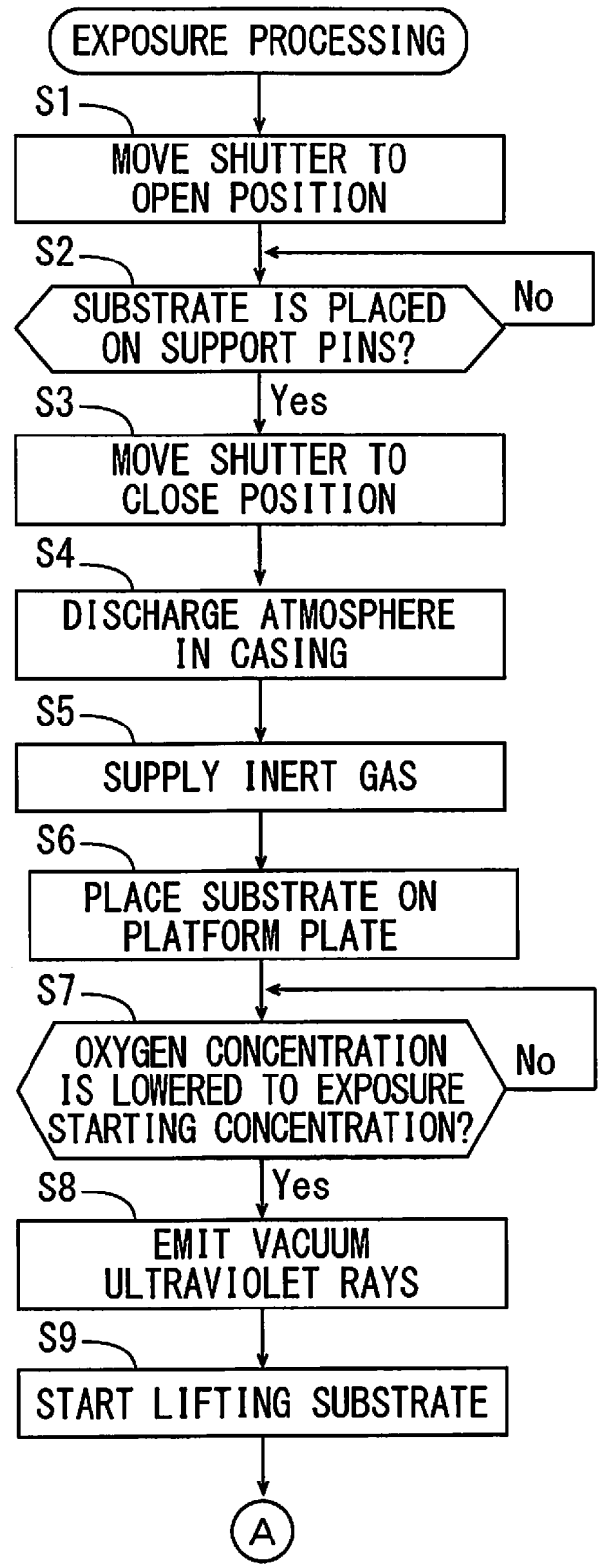
FIG. 12 is a flow chart showing one example of exposure processing performed by the controller of FIG. 7.
Figure 13:
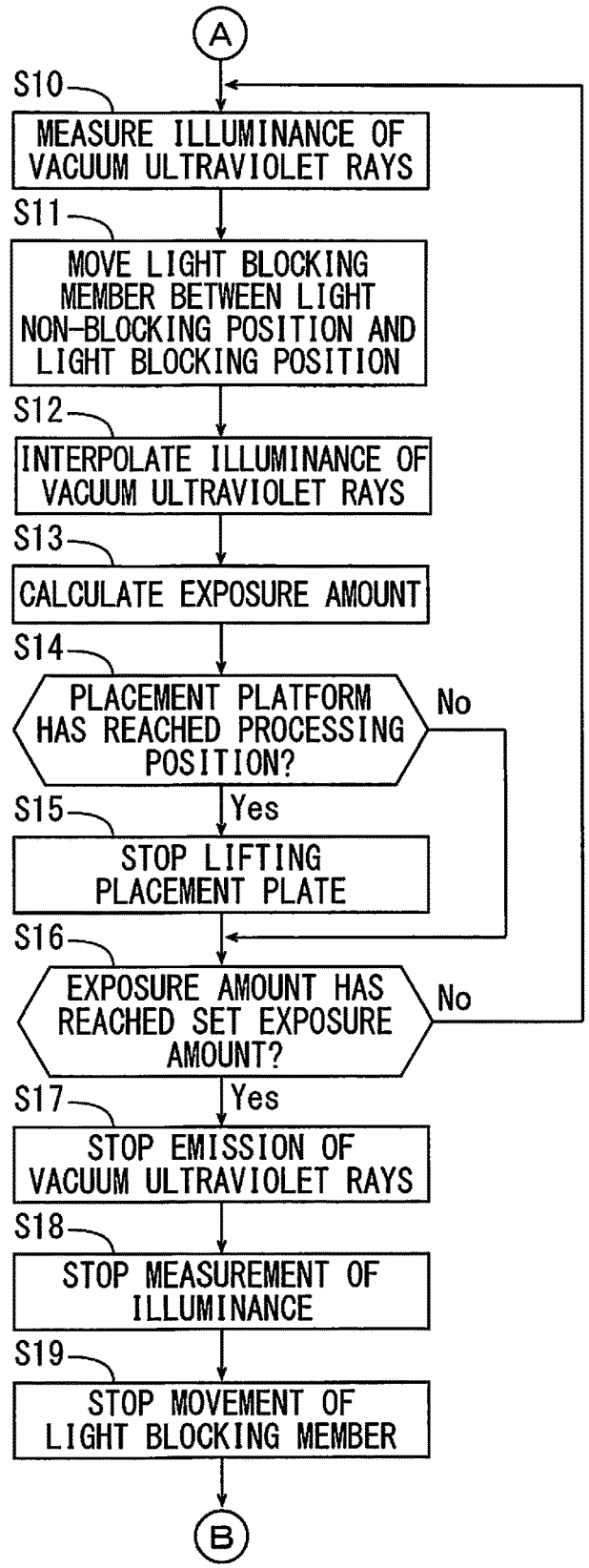
FIG. 13 is a flow chart showing the one example of the exposure processing performed by the controller of FIG. 7.
Figure 14:
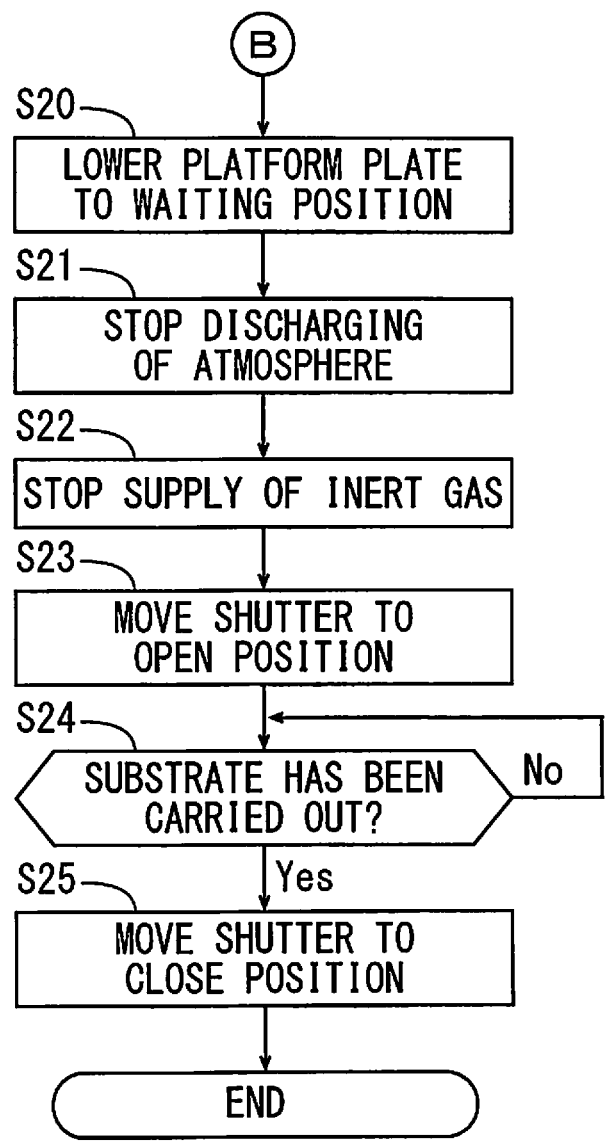
FIG. 14 is a flow chart showing the one example of the exposure processing performed by the controller of FIG. 7.

FIGS. 8 to 11 are schematic diagrams for explaining an operation of the exposure device 100. In FIGS. 8 to 11, part of the constituent elements is not shown and contours of the casing 121 and the housing 161 are indicated by one-dot and dash lines in order to facilitate understanding of the configuration in the casing 121 and the housing 161. FIGS. 12, 13 and 14 are flow charts showing one example of the exposure processing performed by the controller 110 of FIG. 7. The exposure processing performed by the controller 110 is described below with reference to FIGS. 8 to 11.

Figure 8:
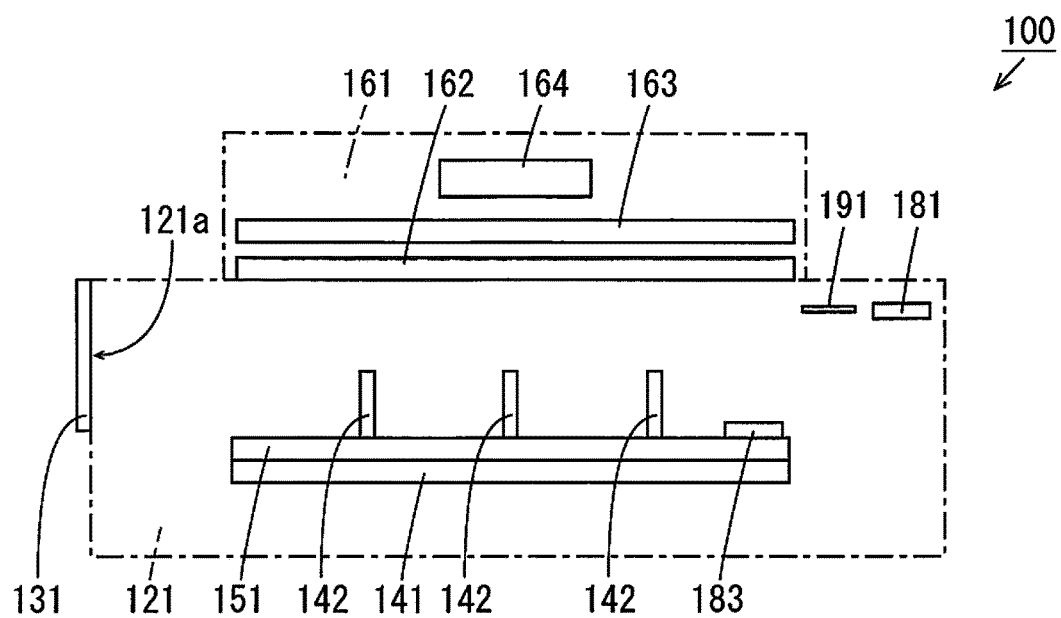
FIG. 8 is a schematic diagram for explaining an operation of the exposure device.

As shown in FIG. 8, in an initial state of the exposure processing, the shutter 131 is located at the close position, the platform plate 151 is located at the waiting position, and the light blocking member 191 is located at the light non-blocking position. Further, the oxygen concentration in the casing 121 is measured at all times or regularly by the oxygen concentration meter 181, and is acquired by the concentration acquirer 5. At this time point, the oxygen concentration in the casing 121 measured by the oxygen concentration meter 181 is equal to the oxygen concentration in the air.

Figure 9:
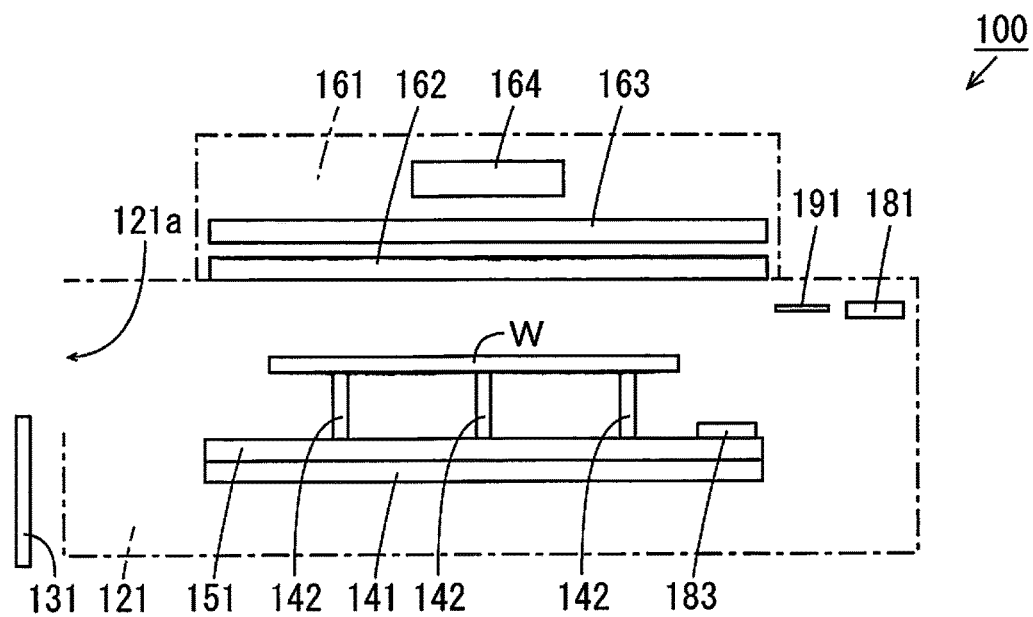
FIG. 9 is a schematic diagram for explaining the operation of the exposure device.

First, as shown in FIG. 9, the closing controller 1 allows the shutter 131 to move to the open position (step S1). Thus, the substrate W to be processed can be placed on the upper ends of the plurality of support pins 142 through the transport opening 121a. In the present example, the substrate W is placed on the upper ends of the plurality of support pins 142 by the transport device 220 of FIG. 15, described below.

Next, the closing controller 1 determines whether the substrate W is placed on the upper ends of the plurality of support pins 142 (step S2). In the case where the substrate W is not placed, the closing controller 1 waits until the substrate W is placed on the upper ends of the plurality of support pins 142. In the case where the substrate W is placed, the closing controller 1 allows the shutter 131 to move to the close position (step S3).

Subsequently, the gas discharge controller 3 allows an atmosphere in the casing 121 to be discharged by the suction device 173 of FIG. 1 (step S4). Further, the gas supply controller 4 allows the inert gas to be supplied into the casing 121 through the pipes 171p, 172p of FIG. 1 (step S5). The process of one of the steps S4, S5 may be started before the process of the other step, or the respective processes of the respective steps S4 and S5 may be started simultaneously. Thereafter, as shown in FIG. 10, the lifting lowering controller 2 allows the platform plate 151 to be lifted from the waiting position, thereby allowing the substrate W to be placed on the platform plate 151 (step S6). The height of a platform surface of the substrate W and the height of the light receiving surface of the illuminometer 183 coincide with each other at this time point.

Next, the concentration comparer 6 determines whether the oxygen concentration in the casing 121 is lowered to the exposure starting concentration (step S7). In the case where the oxygen concentration is not lowered to the exposure starting concentration, the concentration comparer 6 waits until the oxygen concentration is lowered to the exposure starting concentration. In the case where the oxygen concentration is lowered to the exposure starting concentration, the light emission controller 12 allows the light source 163 to emit the vacuum ultraviolet rays (step S8). Thus, the vacuum ultraviolet rays are emitted to the substrate W through the light-transmitting plate 162 from the light source 163, and the exposure of the DSA film formed on the surface to be processed is started. Further, the lifting lowering controller 2 allows the platform plate 151 to be lifted (step S9).

Then, the illuminance acquirer 8 allows the illuminometer 183 to start measuring the illuminance of the vacuum ultraviolet rays, and acquires the measured illuminance from the illuminometer 183 (step S10). Further, the light blocking controller 7 allows the light blocking member 191 to move back and forth a multiple times between the light blocking position and the light non-blocking position (step S11). The process of any one of the steps S8 to S11 may be started earlier than the processes of the other steps, or the respective processes of the respective steps S8 to S11 may be started simultaneously.

The illuminance interpolator 9 interpolates the illuminance of the vacuum ultraviolet rays during the light blocking period (step S12). The exposure amount calculator 10 integrates the illuminance of the vacuum ultraviolet rays acquired by the illuminance acquirer 8 and the illuminance of the vacuum ultraviolet rays interpolated by the illuminance interpolator 9 to calculate an exposure amount of the vacuum ultraviolet rays emitted to the substrate W (step S13).

Thereafter, the lifting lowering controller 2 determines whether the platform plate 151 has reached the processing position (step S14). In the case where the platform plate 151 has not reached the processing position, the lifting lowering controller 2 proceeds to the process of the step S16. On the other hand, in the case where the platform plate 151 has reached the processing position, the lifting lowering controller 2 stops the lifting of the platform plate 151 (step S15). As shown in FIG. 11, in the case where the platform plate 151 has reached the processing position, the substrate W is in close proximity to the light-transmitting plate 162.

Next, the exposure amount comparer 11 determines whether the exposure amount calculated by the exposure amount calculator 10 has reached the set exposure amount (step S16). In the case where the exposure amount has not reached the set exposure amount, the exposure amount comparer 11 returns to the process of the step S10. The process including the steps S10 to S16 is repeated until the exposure amount reaches the set exposure amount.

In the case where the exposure amount reaches the set exposure amount, the light emission controller 12 allows the emission of the vacuum ultraviolet rays from the light source 163 to be stopped (step S17). Further, the illuminance acquirer 8 allows the measurement of illuminance by the illuminometer 183 to be stopped (step S18). Further, the light blocking controller 7 allows the movement of the light blocking member 191 to be stopped (step S19). In the present example, the light blocking member 191 is returned to the light non-blocking position.

Next, as shown in FIG. 10, the lifting lowering controller 2 lowers the platform plate 151 to the waiting position (step S20). Thus, the substrate W is received from the platform plate 151 and transferred onto the plurality of support pins 142. Subsequently, the gas discharge controller 3 allows discharging of an atmosphere in the casing 121 by the suction device 173 to be stopped (step S21). Further, the gas supply controller 4 allows the supply of the inert gas from the pipes 171p, 172p into the casing 121 to be stopped (step S22). The process of any one of the steps S17 to S22 may be started before the processes of the other steps, or the respective processes of the respective steps S17 to S22 may be started simultaneously.

Thereafter, as shown in FIG. 9, the closing controller 1 allows the shutter 131 to move to the open position (step S23). Thus, the substrate W that has been exposed can be carried out of the casing 121 from the upper ends of the plurality of support pins 142 through the transport opening 121a. In the present example, the substrate W is carried out of the casing 121 from the upper ends of the plurality of support pins 142 by the transport device 220 of FIG. 15, described below.

Next, the closing controller 1 determines whether the substrate W has been carried from the upper ends of the plurality of support pins 142 (step S24). In the case where the substrate W has not been carried out, the closing controller 1 waits until the substrate W is carried from the upper ends of the plurality of support pins 142. As shown in FIG. 8, in the case where the substrate W has been carried out, the closing controller 1 allows the shutter 131 to move to the close position (step S25), and ends the exposure processing. The above-mentioned operations are repeated, so that a plurality of substrates W can be sequentially exposed.

In the above-mentioned exposure processing, the vacuum ultraviolet rays are emitted to the substrate W from the light source 163 before the platform plate 151 moves to the processing position. In this case, the vacuum ultraviolet rays are emitted to the substrate W also in a process in which the platform plate 151 moves from the waiting position to the processing position. Therefore, the exposure of the substrate W ends in a shorter period of time. Thus, efficiency of the exposure processing for the substrate W can be more sufficiently improved.

On the other hand, after the platform plate 151 moves to the processing position, the vacuum ultraviolet rays may be emitted from the light source 163 to the substrate W. That is, the process including the steps S9, S14, S15 may be performed during the process including the steps S6 to S8, or may be performed simultaneously with the process of the step S7. In this case, the platform plate 151 can be moved to the processing position during a period in which the oxygen concentration in the casing 121 is lowered to the exposure starting concentration. Therefore, the exposure of the substrate W ends in a shorter period of time. Thus, efficiency of the exposure processing for the substrate W can be more sufficiently improved.

Further, in the above-mentioned exposure processing, the exposure amount of the substrate W reaches the set exposure amount, and then the platform plate 151 moves from the processing position to the waiting position. However, the present invention is not limited to this. The platform plate 151 may move from the processing position to the waiting position before the exposure amount of the substrate W reaches the set exposure amount. That is, the process of the step S20 may be performed before the process of the step S16. In this case, the vacuum ultraviolet rays are emitted to the substrate W also in a process in which the platform plate 151 moves from the processing position to the waiting position. Therefore, the substrate W is carried out from the processing chamber 120 at an earlier time point, and the exposure processing ends. Thus, efficiency of the exposure processing for the substrate W can be more sufficiently improved.

(5) Substrate Processing Apparatus

Figure 15:
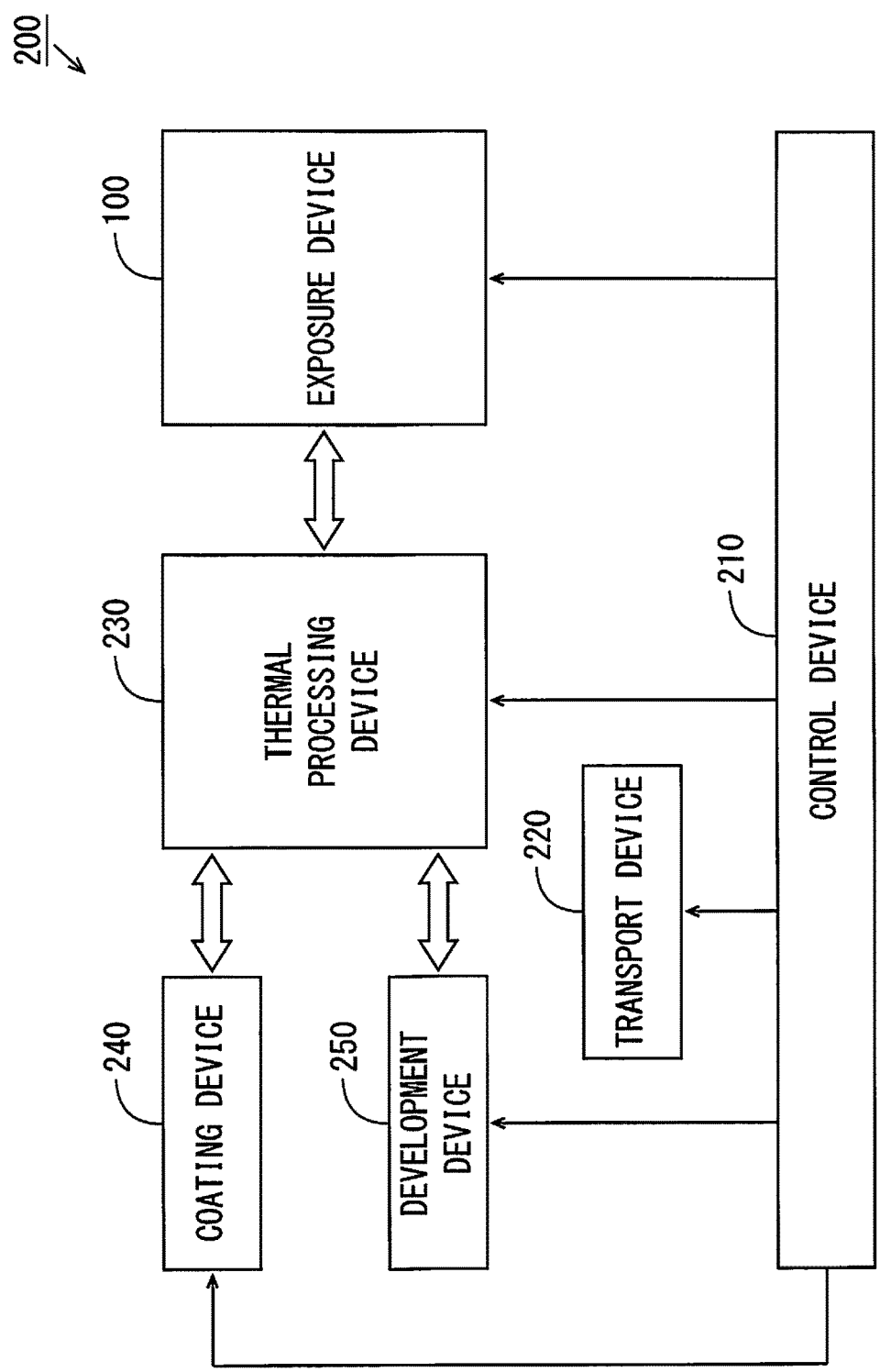
FIG. 15 is a schematic block diagram showing an entire configuration of a substrate processing apparatus including the exposure device of FIG. 1.

FIG. 15 is a schematic block diagram showing the entire configuration of the substrate processing apparatus including the exposure device 100 of FIG. 1. In the substrate processing apparatus 200, described below, processing utilizing Directed Self Assembly (DSA) of a block copolymer is performed. Specifically, a processing liquid including a Directed Self Assembly material is applied onto the surface to be processed of the substrate W. Thereafter, patterns of two types of polymers are formed on the surface to be processed of the substrate W by a microphase separation that occurs in the Directed Self Assembly material. One pattern of the two types of polymers is removed by a solvent.

The processing liquid including the Directed Self Assembly material is referred to as a DSA liquid. Further, processing of removing one pattern of the two types of polymers formed on the surface to be processed of the substrate W by the microphase separation is referred to as development processing, and the solvent used for the development processing is referred to as a development liquid.

As shown in FIG. 15, the substrate processing apparatus 200 includes a control device 210, a transport device 220, a thermal processing device 230, a coating device 240 and a development device 250 in addition to the exposure device 100. The control device 210 includes a CPU and a memory, or a microcomputer, for example, and controls operations of the transport device 220, the thermal processing device 230, the coating device 240 and the development device 250. Further, the control device 210 supplies instructions for controlling operations of the closer 130, the lifter-lowerer 150, the light emitter 160, the replacer 170 and the light blocker 190 of the exposure device 100 of FIG. 1 to the controller 110.

The transport device 220 transports the substrate W among the exposure device 100, the thermal processing device 230, the coating device 240 and the development device 250 while holding the substrate W to be processed. The thermal processing device 230 thermally processes the substrate W before and after the coating processing is performed by the coating device 240 and the development processing is performed by the development device 250.

The coating device 240 supplies the DSA liquid to the surface to be processed of the substrate W, thereby performing the coating processing of a film. In the present embodiment, the block copolymer constituted by the two types of polymers is used as the DSA liquid. Combinations of the two types of the polymers include Polystyrene-Polymethyl Methacrylate (PS-PMMA), Polystyrene-Polydimethylsiloxane (PS-PDMS), Polystyrene-Polyferrocenyl Dimethylsilane (PS-PFS), Polystyrene-Polyethylene Oxide (PS-PEO), Polystyrene-Polyvinyl Pyridine (PS-PVP), Polystyrene-Polyhydroxystyrene (PS-PHOST) or Polymethyl Methacrylate-Polymethacrylate Polyhedral Oligomeric Silsesquioxane (PMMA-PMAPOSS), for example.

The development device 250 supplies the development liquid to the surface to be processed of the substrate W, thereby developing the film. Further, the solvent of the development liquid includes Toluene, Heptane, Acetone, Propylene Glycol Monomethyl Ether Acetate (PGMEA), Propylene Glycol Monomethylether (PGME), Cyclohexanone, Acetic Acid, Tetrahydrofuran, Isopropyl Alcohol (IPA) or Tetramethylammonium Hydroxide (TMAH), for example.

Figure 16A:
FIGS. 16A to 16D are schematic diagrams showing one example of processing for the substrate by the substrate processing apparatus of FIG. 15.
Figure 16B:
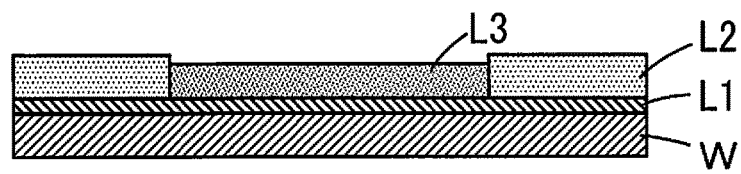

FIGS. 16A to 16D are schematic diagrams showing one example of processing of the substrate W by the substrate processing apparatus 200 of FIG. 15. In FIGS. 16A to 16D, cross sectional views show states of the substrate W that change every time the processing is performed. In the present example, as shown in FIG. 16A, in the initial state, which is a state before the substrate W is carried into the substrate processing apparatus 200, an underlayer L1 is formed to cover the surface to be processed of the substrate W, and a guide pattern L2 made of a photoresist, for example, is formed on the underlayer L1. Operations of the substrate processing apparatus 200 will be described below with use of FIGS. 15 and FIGS. 16A to 16D.

Figure 16C:
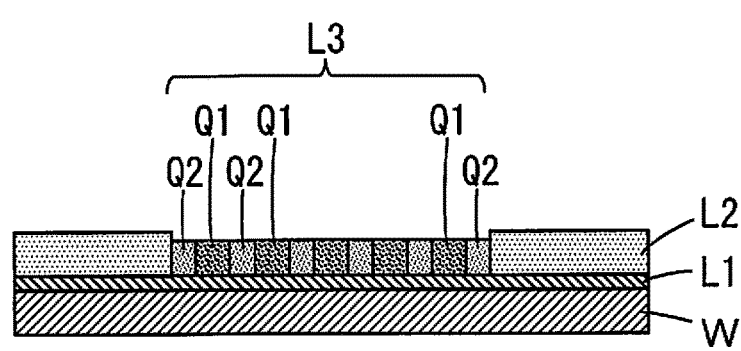
Figure 16D:
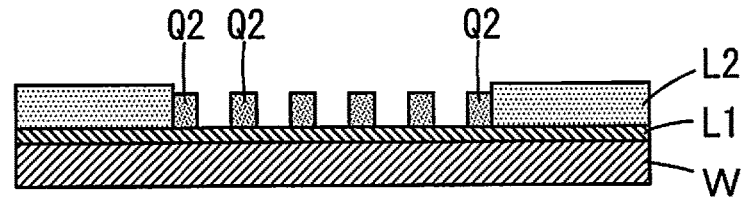

The transport device 220 sequentially transports the substrate W to be processed to the thermal processing device 230 and the coating device 240. In this case, in the thermal processing device 230, a temperature of the substrate W is adjusted to a temperature suitable for formation of a DSA film L3. Further, in the coating device 240, the DSA liquid is supplied to the surface to be processed of the substrate W, and the coating processing is performed. Thus, as shown in FIG. 16D, the DSA film L3 constituted by two types of polymers is formed in a region on the underlayer L1 in which the guide pattern L2 is not formed.

Then, the transport device 220 sequentially transports the substrate W on which the DSA film L3 has been formed to the thermal processing device 230 and the exposure device 100. In this case, the heating processing for the substrate W is performed in the thermal processing device 230, so that a microphase separation occurs in the DSA film L3. Thus, as shown in FIG. 16C, a pattern Q1 made of one polymer and a pattern Q2 made of another polymer are formed. In the present example, the line pattern Q1 and the line pattern Q2 are directionally formed to extend along the guide pattern L2.

Thereafter, the substrate W is cooled in the thermal processing device 230. Further, in the exposure device 100, the vacuum ultraviolet rays for reforming the DSA film L3 are emitted to the entire DSA film L3 in which the microphase separation has occurred, so that the exposure processing is performed. Thus, one polymer is uncoupled from the other polymer, and the pattern Q1 is separated from the pattern Q2.

Subsequently, the transport device 220 sequentially transports the substrate W that has been exposed by the exposure device 100 to the thermal processing device 230 and the development device 250. In this case, the substrate W is cooled in the thermal processing device 230. Further, in the development device 250, the development liquid is supplied to the DSA film L3 on the substrate W, and the development processing is performed. Thus, as shown in FIG. 16D, the pattern Q1 is removed, and the pattern Q2 remains on the substrate W in the end. Finally, the transport device 220 collects the developed substrate W from the development device 250.

(6) Effects

In the exposure device 100 according to the present embodiment, at the time point at which the oxygen concentration in the processing chamber 120 measured by the oxygen concentration meter 181 is lowered to the exposure starting concentration, emission of the vacuum ultraviolet rays by the light source 163 to the substrate W is started. Here, the exposure starting concentration is defined in advance to be higher than 1% and lower than the oxygen concentration in the air, and is defined in advance such that ozone generated by the oxygen atoms due to the emission of the vacuum ultraviolet rays does not damage the film on the surface to be processed of the substrate W.

Therefore, the vacuum ultraviolet rays are emitted to the substrate W from the light source 163 at a time point that is earlier than the time point at which the oxygen concentration in the processing chamber 120 is lowered to 1%. Although a small amount of ozone is generated by the emission of the vacuum ultraviolet rays to the substrate W at this time point, this ozone does not damage the film formed on the surface to be processed of the substrate W. Therefore, a time period required for the exposure processing can be shortened. Thus, efficiency of the exposure processing for the substrate W can be improved.

[2] Second Embodiment

Figure 17:
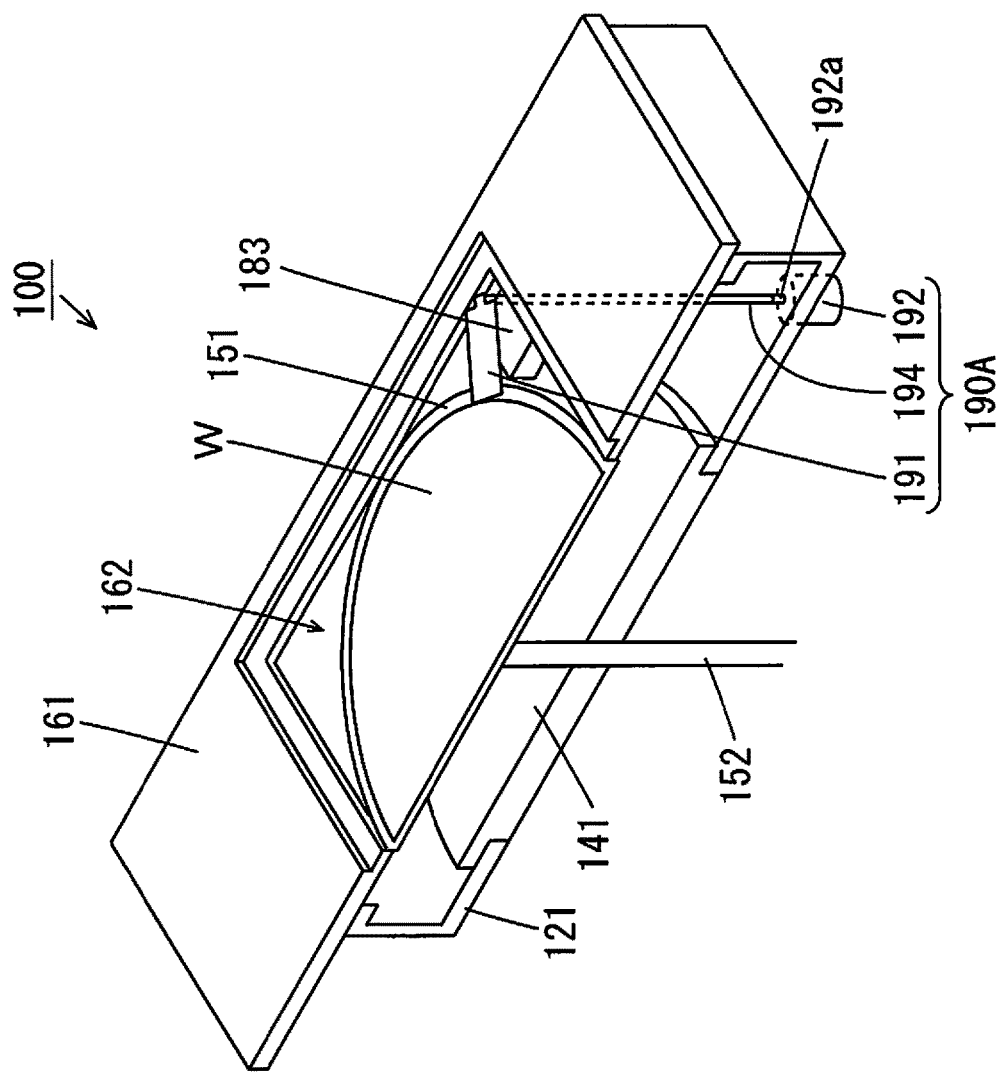
FIG. 17 is a cross sectional perspective view of an exposure device in a second embodiment of the present invention.
Figure 18:
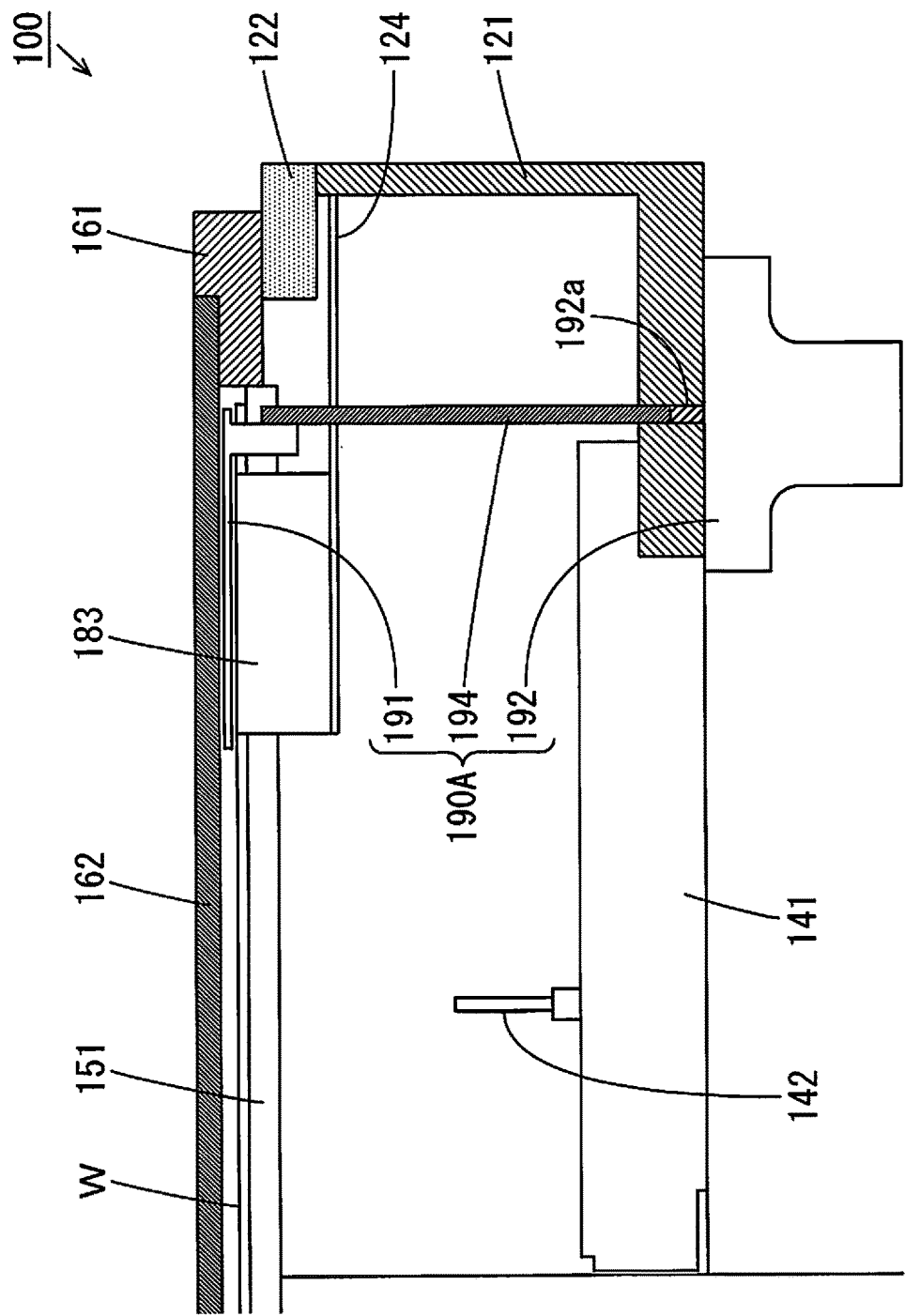
FIG. 18 is a longitudinal cross sectional view of the exposure device of FIG. 17.

As for an exposure device and a substrate processing apparatus according to the second embodiment, differences from the exposure device and the substrate processing apparatus according to the first embodiment will be described. FIG. 17 is a cross sectional perspective view of the exposure device in the second embodiment of the present invention. FIG. 18 is a longitudinal cross sectional view of the exposure device 100 of FIG. 17. In FIGS. 17 and 18, part of the constituent elements is not shown in order to facilitate understanding of an inner configuration of the exposure device 100.

As shown in FIG. 18, in the exposure device 100 according to the present embodiment, an illuminometer 183 is fixed to an inner surface of a casing 121 by a fixing member 124. The illuminometer 183 is arranged to overlap with a portion in the vicinity of one corner of a light-transmitting plate 162 when seen in plan view, and the illuminometer 183 is arranged such that a light receiving surface of a light receiving element is located at a height that is substantially the same as a height of the surface to be processed of the substrate W located at the processing position. In this manner, in the present embodiment, the illuminometer 183 is not attached to a platform plate 151, so that the platform plate 151 does not have the corner portion 151*c* of FIG. 2 for attaching the illuminometer 183.

Further, as shown in FIGS. 17 and 18, the exposure device 100 according to the present embodiment includes a light blocker 190A instead of the light blocker 190 of FIG. 3. The light blocker 190A includes a light blocking member 191, a driving device 192 and a bar-shape support member 194. The light blocking member 191 is a shutter, for example, and is provided to be movable between a light blocking position at which the vacuum ultraviolet rays emitted from a light source 163 to the illuminometer 183 are blocked and a light non-blocking position at which the vacuum ultraviolet rays are not blocked.

A driving device 192 is a stepping motor, for example, and has a rotatable driving shaft 192*a*. The driving device 192 is attached to a lower surface of a casing 121 such that the driving shaft 192*a* is directed upwardly. A support member 194 couples the light blocking member 191 to the driving shaft 192*a* of the driving device 192 to extend in the up-and-down direction. The driving shaft 192*a* of the driving device 192 rotates about an axis in parallel with the up-and-down direction, so that the light blocking member 191 moves between the light blocking position and the light non-blocking position.

In the present embodiment, the illuminometer 183 does not move in the up-and-down direction. Therefore, in the exposure processing, it is preferable that, after the substrate W moves to the processing position and the surface to be processed of the substrate W and the light receiving surface of the light receiving element of the illuminometer 183 are at substantially the same height, the vacuum ultraviolet rays are preferably emitted from the light source 163. Therefore, in the exposure processing in the present embodiment, the process including the steps S9, S14, S15 of FIGS. 12 to 14 is preferably performed during the process including the steps S6 to S8.

[3] Third Embodiment

Figure 19:
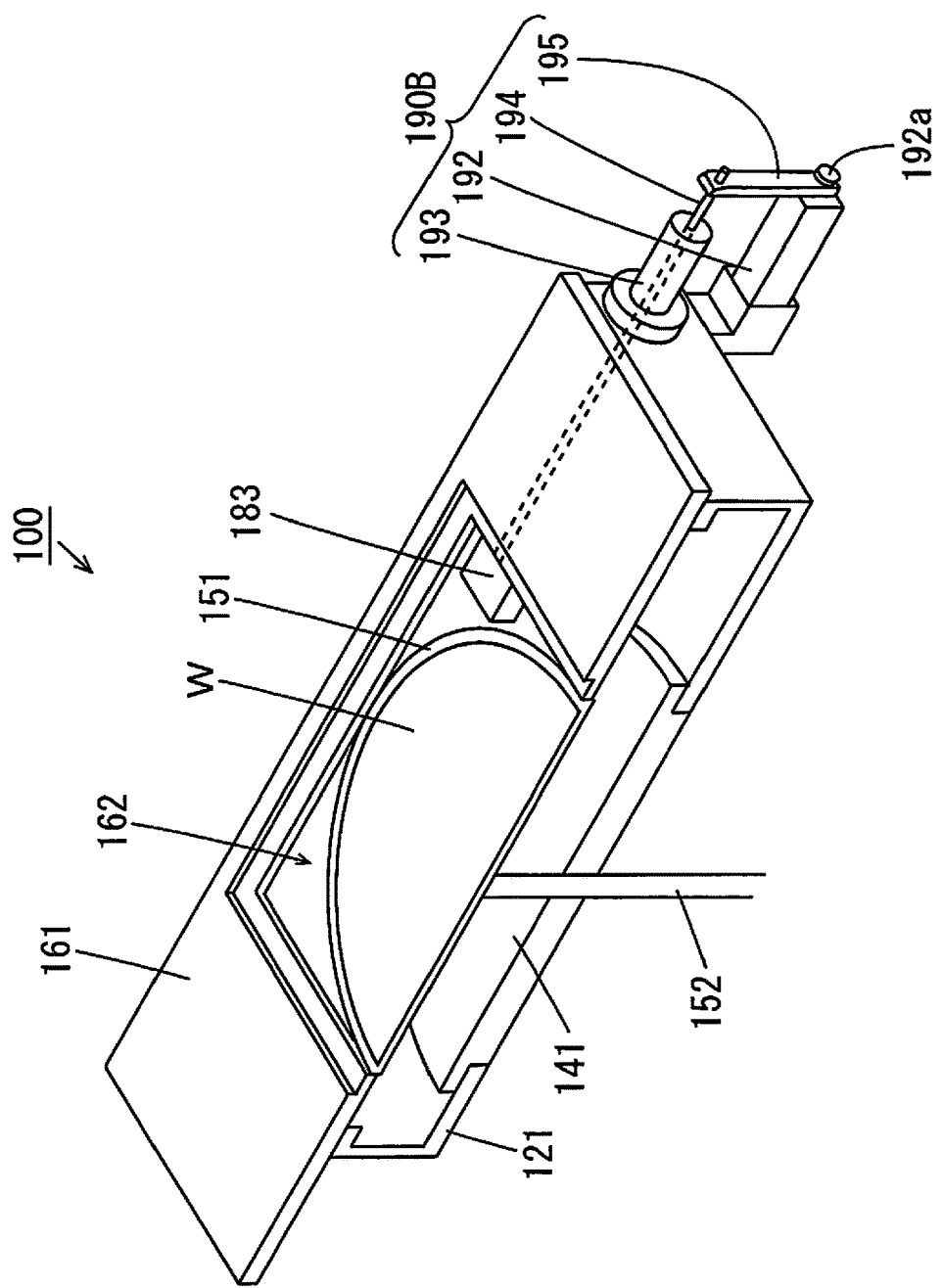
FIG. 19 is a cross sectional perspective view of an exposure device in a third embodiment of the present invention.
Figure 20:
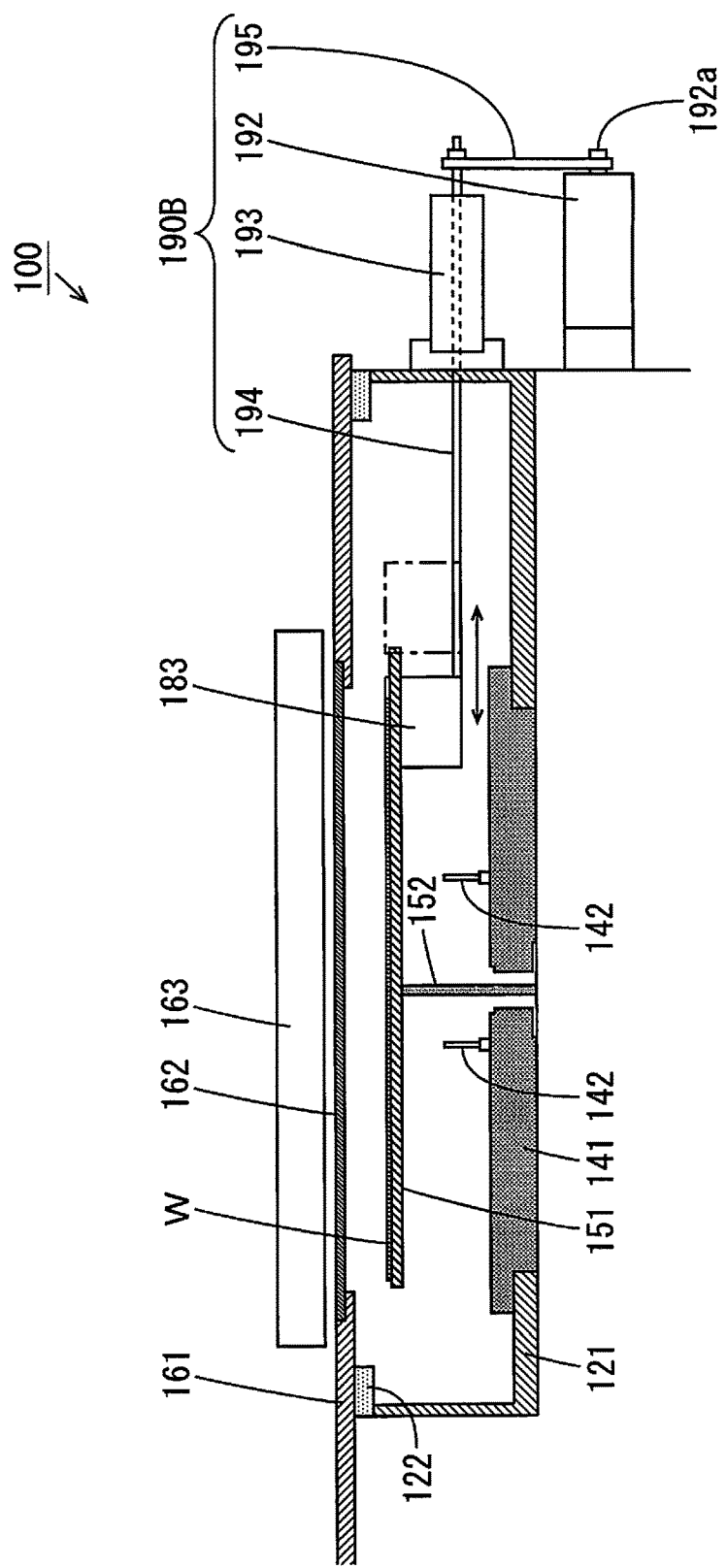
FIG. 20 is a longitudinal cross sectional view of the exposure device of FIG. 19.

As for an exposure device and a substrate processing apparatus according to the third embodiment, differences from the exposure device and the substrate processing apparatus according to the first embodiment will be described. FIG. 19 is a cross sectional perspective view of the exposure device in the third embodiment of the present invention. FIG. 20 is a longitudinal cross sectional view of the exposure device 100 of FIG. 19. In FIGS. 19 and 20, part of the constituent elements is not shown in order to facilitate understanding of an inner configuration of the exposure device 100.

As shown in FIGS. 19 and 20, the exposure device 100 according to the present embodiment includes a light blocker 190B instead of the light blocker 190 of FIG. 3. The light blocker 190B has a configuration similar to that of the light blocker 190 of FIG. 3 except that the light blocking member 191 is not included. A support member 194 supports an illuminometer 183 by one end portion instead of the light blocking member 191. Similarly to the second embodiment, the illuminometer 183 is not attached to a platform plate 151 in the present embodiment. Thus, the platform plate 151 does not have the corner portion 151*c* of FIG. 2 for attaching the illuminometer 183.

As indicated by an arrow in FIG. 20, a driving shaft 192*a* of a driving device 192 advances and retreats, whereby the illuminometer 183 moves between a light non-blocking position at which the illuminometer 183 can receive the vacuum ultraviolet rays and a light blocking position at which the illuminometer 183 cannot receive the vacuum ultraviolet rays. In FIG. 20, the illuminometer 183 located at the light non-blocking position is indicated by a solid line, and the illuminometer 183 located at the light blocking position is indicated by a one-dot and dash line. Specifically, the light non-blocking position is a position that overlaps with a portion in the vicinity of one corner portion of a light-transmitting plate 162 when seen in plan view. The light blocking position is a position farther outward than the light-transmitting plate 162 when seen in plan view.

That is, in the present embodiment, during the exposure processing, not the light blocking member 191 but the illuminometer 183 moves between the light non-blocking position and the light blocking position. Therefore, in the exposure processing in the present embodiment, in the step S11 of FIG. 13, not the light blocking member 191 but the illuminometer 183 moves between the light non-blocking position and the light blocking position. Further, in the step S19 of FIG. 13, not the movement of the light blocking member 191 but the movement of the illuminometer 183 is stopped.

Further, also in the present embodiment, illuminance of the vacuum ultraviolet rays emitted to the substrate W during a light non-receiving period is preferably interpolated. An interpolation method of illuminance during the light non-receiving period of the present embodiment is similar to the interpolation method of illuminance during the light blocking period of the first embodiment.

Further, in the present embodiment, the illuminometer 183 does not move in the up-and-down direction similarly to the second embodiment. Therefore, in the exposure processing, it is preferable that, after the substrate W moves to a processing position and the surface to be processed of the substrate W is at a height that is substantially the same as a height of the light receiving surface of the light receiving element of the illuminometer 183, the vacuum ultraviolet rays are emitted from a light source 163. Therefore, in the exposure processing in the present embodiment, the process including the steps S9, S14, S15 of FIGS. 12 to 14 is preferably performed during the process including the steps S6 to S8.

[4] Other Embodiments (1) While the DSA liquid is used as the processing liquid in the first to third embodiments, the present invention is not limited to this. Another processing liquid different from the DSA liquid may be used.

(2) The emission surface of the vacuum ultraviolet rays is larger than the surface to be processed of the substrate W in the first to third embodiments, and the entire surface of the substrate W is exposed. However, the present invention is not limited to this. An emission surface of the vacuum ultraviolet rays may be smaller than a surface to be processed of the substrate W, and planar vacuum ultraviolet rays do not have to be emitted. In this case, the emission surface of the vacuum ultraviolet rays and the surface to be processed of the substrate W move relative to each other, so that the vacuum ultraviolet rays are emitted to the entire surface to be processed of the substrate W.

(3) While the inert gas is supplied into the casing 121 during the exposure processing in the first to third embodiments, the present invention is not limited to this. In the case where the oxygen concentration in the casing 121 can be lowered sufficiently during the exposure processing, the inert gas does not have to be supplied into the casing 121.

(4) While the light-transmitting plate 162 is rectangular in the first to third embodiments, the present invention is not limited to this. A light-transmitting plate 162 may be in another shape such as a circle, an oblong, an ellipse, a polygon except for a rectangle, or the like. In this case, an illuminometer 183 is arranged at a position that overlaps with a non-overlapping region of the light-transmitting plate 162 and a surface to be processed of the substrate W when seen in plan view. Thus, the illuminometer 183 can measure the illuminance of the vacuum ultraviolet rays without interfering with the substrate W.

(5) While the illuminometer 183 is attached to the platform plate 151 in the first embodiment, the present invention is not limited to this. As long as an illuminometer 183 follows the movement of a platform plate 151 and is movable in the up-and-down direction, the illuminometer 183 does not have to be attached to the platform plate 151. In this case, the illuminometer 183 may be configured to be movable by a driving device 153, which is also a driving device for the platform plate 151, or may be configured to be movable by a driving device different from the driving device 153.

(6) While the light blocker 190A is provided in the exposure device 100 in the second embodiment, the present invention is not limited to this. Not the light blocker 190A but a light blocker 190 similar to the light blocker 190 of the first embodiment may be provided in an exposure device 100.

(7) In the second embodiment, the illuminometer 183 is fixed, and the light blocking member 191 is configured to be movable by the driving device 192. However, the present invention is not limited to this. A light blocking member 191 may be fixed, and an illuminometer 183 may be configured to be movable by a driving device 192. That is, the illuminometer 183 and the light blocking member 191 may be movable relative to each other. In this configuration, a position at which the illuminometer 183 and the light blocking member 191 overlap with each other when seen in plan view is a light blocking position, and a position at which the illuminometer 183 and the light blocking member 191 do not overlap with each other when seen in plan view is a light non-blocking position.

Also in the first embodiment, the light blocking member 191 may be fixed, and the illuminometer 183 may be configured to be movable by the driving device 192. In this case, it is preferable that the corner portion 151c, to which the illuminometer 183 is attached, of the platform plate 151 is preferably configured to be movable in a horizontal plane independently from the circular portion 151b.

(8) While the illuminometer 183 is arranged such that the light receiving surface is at the height that is substantially the same as the height of the surface to be processed of the substrate W located at the processing position in the first to third embodiments, the present invention is not limited to this. The illuminometer may be arranged such that the light receiving surface 183 is located at the constant height, which is based on the surface to be processed of the substrate W located at the processing position. Further, in the case where the illuminometer 183 can measure the illuminance of the vacuum ultraviolet rays sufficiently accurately, the vacuum ultraviolet rays emitted to the substrate W that is in a process of being moved to the processing position may be measured in the second and third embodiments.

(9) While the exposure device 100 includes the light blockers 190, 190A, 190B in the first to third embodiments, the present invention is not limited to this. The exposure device 100 does not have to include the light blockers 190, 190A, 190B. Therefore, the illuminance during the light blocking period does not have to be interpolated, and the controller 110 does not have to include the light blocking controller 7 and the illuminance interpolator 9.

[5] Correspondences between Constituent Elements in Claims and Parts in Preferred Embodiments In the following paragraphs, non-limiting examples of correspondences between various elements recited in the claims below and those described above with respect to various preferred embodiments of the present invention are explained.

In the above-mentioned embodiment, the substrate W is an example of a substrate, the processing chamber 120 is an example of a processing chamber, the light source 163 is an example of a light source, the suction device 173 is an example of a gas discharger, the oxygen concentration meter 181 is an example of an oxygen concentration meter, the illuminometer 183 is an example of an illuminometer, the exposure amount calculator 10 is an example of an exposure amount calculator, the light emission controller 12 is an example of a light source controller, the exposure device 100 is an example of an exposure device, the pipes 171p, 172p are examples of a gas supplier, and the platform plate 151 is an example of a platform. The lifting lowering controller 2 is an example of a platform controller, the coating device 240 is an example of a coater, the thermal processing device 230 is an example of a thermal processor, the development device 250 is an example of a developer, and the substrate processing apparatus 200 is an example of a substrate processing apparatus.

As each of constituent elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

We claim:

1. An exposure device comprising:
a processing chamber that stores a substrate having a film that has been formed on a surface to be processed;
a light source provided to be emittable of vacuum ultraviolet rays to the substrate stored in the processing chamber;
a gas discharger that discharges an atmosphere in the processing chamber;
an oxygen concentration meter that measures oxygen concentration in the processing chamber;
an illuminometer that receives part of the vacuum ultraviolet rays and measures illuminance of the received vacuum ultraviolet rays during an emission period in which the vacuum ultraviolet rays are emitted from the light source to the substrate;
an exposure amount calculator that calculates an exposure amount of the substrate based on the illuminance measured by the illuminometer; and
a light source controller that controls the light source such that emission of the vacuum ultraviolet rays by the light source to the substrate is started at a time point at which the oxygen concentration measured by the oxygen concentration meter is lowered to predetermined exposure starting concentration, and controls the light source such that the emission of the vacuum ultraviolet rays by the light source to the substrate is stopped at a time point at which the exposure amount calculated by the exposure amount calculator is increased to a predetermined set exposure amount, wherein the exposure starting concentration is defined in advance to be higher than 1% and lower than oxygen concentration in air, and is defined such that ozone generated from oxygen atoms by the emission of the vacuum ultraviolet rays does not damage the film on the surface to be processed of the substrate.

2. The exposure device according to claim 1, further comprising a gas supplier that supplies an inert gas into the processing chamber.

3. The exposure device according to claim 1, further comprising:
a platform, which is provided below the light source and on which the substrate is placed, and
a platform controller that controls the platform such that the platform moves to a first position when the substrate is received and transferred between an inside and an outside of the processing chamber, and controls the platform such that the platform moves to a second position that is farther upward than the first position before or during the emission period in which the vacuum ultraviolet rays are emitted from the light source to the substrate.

4. The exposure device according to claim 3, wherein the platform controller, after the substrate is placed on the platform at the first position, controls the platform such that the platform starts moving from the first position to the second position after the emission of the vacuum ultraviolet rays from the light source to the substrate is started.

5. The exposure device according to claim 3, wherein the placement controller, after the substrate is placed on the platform at the first position, controls the platform such that the platform starts moving from the first position to the second position before the emission of the vacuum ultraviolet rays from the light source to the substrate is started.

6. The exposure device according to claim 3, wherein the placement controller, after the vacuum ultraviolet rays are emitted to the substrate placed on the platform at the second position, controls the platform such that the platform starts moving from the second position to the first position before the exposure amount calculated by the exposure amount calculator increases to the set exposure amount.

7. The exposure device according to claim 3, wherein the illuminometer has a light receiving surface that receives the vacuum ultraviolet rays, and is arranged such that the light receiving surface is located at a constant height, which is based on the surface to be processed of the substrate during the emission period of the vacuum ultraviolet rays.

8. The exposure device according to claim 7, wherein the illuminometer is arranged such that the light receiving surface is located at a height that is same as a height of the surface to be processed of the substrate during the emission period of the vacuum ultraviolet rays.

9. The exposure device according to claim 3, wherein the illuminometer follows movement of the platform and moves in an up-and-down direction.

10. The exposure device according to claim 9, wherein the illuminometer is attached to the platform.

11. The exposure device according to claim 1, wherein the light source is configured to emit the vacuum ultraviolet rays having planar cross sections.

12. The exposure device according to claim 11, wherein an emission area of the vacuum ultraviolet rays emitted by the light source is larger than an area of the substrate.

13. A substrate processing apparatus comprising:
a coater that forms a film on a substrate by applying a processing liquid to the substrate;
a thermal processor that thermally processes the substrate on which the film has been formed by the coater;
the exposure device according to claim 1 that exposes the substrate that has been thermally processed by the thermal processor; and
a developer that develops the film on the substrate by supplying a solvent to the substrate that has been exposed by the exposure device.

14. The substrate processing apparatus according to claim 13, wherein
the processing liquid includes a Directed Self Assembly material.

15. An exposure method including the steps of:
storing a substrate having a film that has been formed on a surface to be processed in a processing chamber;
discharging an atmosphere in the processing chamber by a gas discharger;
measuring oxygen concentration in the processing chamber by an oxygen concentration meter;
starting emission of vacuum ultraviolet rays by a light source to the substrate at a time point at which the oxygen concentration measured by the oxygen concentration meter is lowered to predetermined exposure starting concentration;
receiving part of the vacuum ultraviolet rays by an illuminometer and measuring illuminance of the received vacuum ultraviolet rays during an emission period in which the vacuum ultraviolet rays are emitted from the light source to the substrate;
calculating an exposure amount of the substrate based on the illuminance measured by the illuminometer; and
stopping the emission of the vacuum ultraviolet rays by the light source to the substrate at a time point at which the calculated exposure amount increases to a predetermined set exposure amount, wherein
the exposure starting concentration is defined in advance to be higher than 1% and lower than oxygen concentration in air, and is defined in advance such that ozone generated from oxygen atoms by the emission of the vacuum ultraviolet rays does not damage the film on the surface to be processed of the substrate.

16. A substrate processing method including the steps of:
forming a film on a substrate by applying a processing liquid to a surface to be processed of the substrate by a coater;
thermally processing the substrate, on which the film has been formed by the coater, by a thermal processor;
the exposure method according to claim 15 that exposes the substrate, which has been thermally processed by the thermal processor, by an exposure device; and
developing the film of the substrate by supplying a solvent to the surface to be processed of the substrate, which has been exposed by the exposure device, by a developer.

* * * * *